(12) United States Patent
Neeley et al.

(10) Patent No.: US 9,726,715 B2
(45) Date of Patent: Aug. 8, 2017

(54) MAINTENANCE MANAGEMENT SYSTEMS AND METHODS

(75) Inventors: John Neeley, Seattle, WA (US); Jordan Schlichting, New Hope, MN (US); Thomas McManus, Plymouth, MN (US); Peter Bergstrom, Saint Paul, MN (US); Lindsey Berdan, Seattle, WA (US); Joseph V. Ferrante, Redmond, WA (US); Michael Devin Stuart, Issaquah, WA (US)

(73) Assignee: Fluke Corporation, Everett, WA (US)

( * ) Notice: Subject to any disclaimer, the term of this patent is extended or adjusted under 35 U.S.C. 154(b) by 698 days.

(21) Appl. No.: 13/566,947

(22) Filed: Aug. 3, 2012

(65) Prior Publication Data

US 2013/0124136 A1 May 16, 2013

Related U.S. Application Data

(60) Provisional application No. 61/514,842, filed on Aug. 3, 2011.

(51) Int. Cl.
*G01R 31/28* (2006.01)
*G06F 11/22* (2006.01)

(52) U.S. Cl.
CPC ...... *G01R 31/2834* (2013.01); *G06F 11/2294* (2013.01)

(58) Field of Classification Search
CPC .. G01R 31/2834; G06F 11/2294; H04L 1/244
See application file for complete search history.

(56) References Cited

U.S. PATENT DOCUMENTS 4,888,771 A * 12/1989 Benignus et al. ............... 714/26
5,386,117 A 1/1995 Piety et al.
(Continued)

FOREIGN PATENT DOCUMENTS

CA 2152024 A1 12/1995
JP 4-127018 A 4/1992
(Continued)

OTHER PUBLICATIONS

International Search Report and Written Opinion, mailed Apr. 29, 2013, issued in corresponding International Application No. PCTUS2012049647, filed Mar. 8, 2012, 10 pages.
(Continued)

*Primary Examiner* — Alexander Satanovsky
(74) *Attorney, Agent, or Firm* — Seed IP Law Group LLP

(57) ABSTRACT

Systems and techniques for obtaining and maintaining maintenance records for various assets are described. In one embodiment, a computing device may be wirelessly coupled to a measurement device when the computing device is placed in proximity with the computing device. Upon measuring one or more parameters of a device under test (DUT), the measurement device may provide the measured parameters to the computing device in the form of measurement data. In some embodiments, the computing device associates the measured parameters with the corresponding DUT from which the measurements were obtained and provides the associated measured parameter to, for example, a service provider for future access. In another embodiment, the measurement device itself is configured to associate the measurement parameters with the DUT and provide the associated measurement parameters to the service provider.

21 Claims, 21 Drawing Sheets

(56) References Cited

U.S. PATENT DOCUMENTS

| | | |
|---|---|---|
| 5,637,871 A | 6/1997 | Piety et al. |
| 5,664,207 A | 9/1997 | Crumpler et al. |
| 6,339,499 B1 | 1/2002 | Shirai |
| 7,076,239 B2 | 7/2006 | Kirkup et al. |
| 7,191,184 B2 | 3/2007 | Laborde et al. |
| 7,304,618 B2 | 12/2007 | Plathe |
| 7,454,050 B2 | 11/2008 | Garvey |
| 7,478,305 B2 | 1/2009 | Betawar et al. |
| 7,528,372 B2 | 5/2009 | Garvey, III et al. |
| 7,561,200 B2 | 7/2009 | Garvey, III et al. |
| 7,703,032 B2 | 4/2010 | Wells |
| 7,706,596 B2 | 4/2010 | Garvey |
| 7,728,275 B2 | 6/2010 | Blanchard |
| 7,902,507 B1 | 3/2011 | Garvey, III et al. |
| 7,995,830 B2 | 8/2011 | Garvey |
| 8,003,942 B2 | 8/2011 | Garvey, III et al. |
| 8,005,638 B1 | 8/2011 | Mehta et al. |
| 8,119,986 B1 | 2/2012 | Garvey, III et al. |
| 8,124,923 B2 | 2/2012 | Blanchard |
| 8,148,687 B1 | 4/2012 | Praly |
| 8,300,922 B1 | 10/2012 | Garvey, III |
| 8,334,513 B1 | 12/2012 | Garvey, III et al. |
| 8,358,903 B1 | 1/2013 | Meads et al. |
| 8,368,001 B2 | 2/2013 | Blanchard |
| 8,447,541 B2 | 5/2013 | Rada et al. |
| 8,624,921 B2 | 1/2014 | McGreevy et al. |
| 8,754,779 B2 | 6/2014 | Ruther |
| 8,976,039 B2 | 3/2015 | O'Hara et al. |
| 2001/0038343 A1 | 11/2001 | Meyer et al. |
| 2002/0188411 A1* | 12/2002 | Schiltz et al. .................. 702/56 |
| 2004/0249605 A1 | 12/2004 | Komatsu |
| 2005/0125512 A1 | 6/2005 | Fuller, III et al. |
| 2006/0071812 A1 | 4/2006 | Mason, Jr. et al. |
| 2006/0241792 A1 | 10/2006 | Pretlove et al. |
| 2007/0118323 A1 | 5/2007 | Ishizuka |
| 2008/0155354 A1* | 6/2008 | Kolman ......... G01R 31/318314 714/45 |
| 2008/0231719 A1 | 9/2008 | Benson et al. |
| 2009/0210814 A1 | 8/2009 | Agrusa et al. |
| 2010/0118137 A1* | 5/2010 | Avila et al. ................... 348/125 |
| 2011/0055632 A1* | 3/2011 | Zimmerman ................... 714/31 |
| 2011/0099424 A1 | 4/2011 | Rivera Trevino et al. |
| 2011/0122251 A1 | 5/2011 | Schmidt |
| 2011/0137678 A1 | 6/2011 | Williams |
| 2011/0288810 A1 | 11/2011 | Ishikawa et al. |
| 2012/0004886 A1 | 1/2012 | Jordil et al. |
| 2012/0038760 A1* | 2/2012 | Kantzes ............... G05B 19/042 348/61 |
| 2012/0047424 A1 | 2/2012 | Rothschild |
| 2012/0130223 A1 | 5/2012 | Reicher |
| 2012/0172023 A1 | 7/2012 | Griff et al. |
| 2012/0178438 A1 | 7/2012 | Vashi et al. |
| 2012/0224067 A1 | 9/2012 | Stuart et al. |
| 2012/0229270 A1 | 9/2012 | Morley et al. |
| 2012/0270505 A1 | 10/2012 | Prakash et al. |
| 2012/0300089 A1 | 11/2012 | Sbaiz et al. |
| 2012/0320189 A1 | 12/2012 | Stuart et al. |
| 2013/0009788 A1 | 1/2013 | Langenberg et al. |
| 2013/0029683 A1 | 1/2013 | Kim et al. |
| 2013/0065633 A1 | 3/2013 | Sridhara et al. |
| 2013/0066576 A1 | 3/2013 | Cs et al. |
| 2013/0124136 A1 | 5/2013 | Neeley et al. |
| 2013/0127904 A1 | 5/2013 | Dove et al. |
| 2013/0307992 A1 | 11/2013 | Erlandsson et al. |
| 2014/0270546 A1 | 9/2014 | Neeley et al. |

FOREIGN PATENT DOCUMENTS

| | | |
|---|---|---|
| JP | 2009-25180 A | 2/2009 |
| JP | 2010-26907 A | 2/2010 |
| KR | 10 2008 0112692 A | 12/2008 |
| KR | 10 2012 0065540 A | 6/2012 |
| KR | 10 2012 0077332 A | 7/2012 |
| WO | 2013/020110 A2 | 2/2013 |
| WO | 2013/020110 A3 | 2/2013 |

OTHER PUBLICATIONS

Extech Instruments, "Extech EX540 Wireless Datalogging selected as 2010 EC&M Product of the Year Category Winner," Press Release, Mar. 18, 2009, 2 pages.

Extech Instruments, "Extech EX845 METERLiNK™ Clamp Meter Transmit Readings to FLIR IR Cameras," Press Release, Apr. 1, 2010, 3 pages.

Extech Instruments, "MultiMeter/Datalogger with Wireless PC Interface," Product Datasheet, Jul. 14, 2011, 1 page.

Extech Instruments, "Wireless TRMS Multimeter—Model EX540," User's Guide, Apr. 1, 2010, 17 pages.

International Search Report, mailed Jul. 10, 2014, for International Application No. PCT/US2014/029561, 2 pages.

International Search Report and Written Opinion, mailed Sep. 12, 2014, for International Application No. PCT/US2014/029867, 12 pages.

International Search Report and Written Opinion, mailed Jul. 24, 2014, for International Application No. PCT/US2014/029879, 12 pages.

International Search Report and Written Opinion, mailed Jul. 22, 2014, for International Application No. PCT/US2014/029883, 13 pages.

International Search Report and Written Opinion, mailed Jul. 18, 2014, for International Application No. PCT/US2014/029885, 16 pages.

International Search Report and Written Opinion, mailed Jul. 17, 2014, for International Application No. PCT/US2014/029889, 13 pages.

Extended European Search Report, mailed Oct. 21, 2016, for European Application No. 14763324.2-1855 / 2973111, 8 pages.

Notification of Rejection Reason(s), dated Jun. 28, 2016, for Japanese Application No. 2014-524143, 6 pages (with English Translation).

* cited by examiner

| Asset Type | | |
|---|---|---|
| | Electrical: ☑ | Process: ☐ |
| | mechanical: ☐ | Other: ☐ |
| | Pump: ☐ | Transistor: ☐ |
| | Motor: ☑ | Switch: ☐ |
| | Breaker: ☐ | MCC: ☐ |
| | Generator: ☐ | Disconnect: ☐ |

1110

Home | Back | Next | Done

*Fig. 11.*

MAINTENANCE MANAGEMENT SYSTEMS AND METHODS

CROSS-REFERENCE TO RELATED APPLICATION

This application claims the benefit of Provisional Application No. 61/514,842, filed Aug. 3, 2011, which is hereby incorporated by reference.

BACKGROUND

Assets, such as electrical and mechanical equipment, are used for a variety of applications and typically require routine maintenance. In order to maintain the asset and confirm that the asset is operating within set parameters, measurement and/or calibration devices may be used to measure the asset's current operating parameters. Often, measurement data generated by the measurement and/or calibration devices is monitored over a period of time to provide a more detailed understanding of the asset's operation. Maintaining measurement data over periods of time may be difficult, particularly when there are various types, quantities, applications, etc., of the asset involved.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure, a method is provided for obtaining and maintaining maintenance records. The method includes placing a computing device in proximity with a measurement device, establishing a communication link between the computing device and the measurement device, measuring, using the measurement device, one or more parameters of a device under test (DUT) to obtain measurement data prior to or after the establishment of the communication link, transmitting the measurement data from the measurement device to the computing device, associating the measurement data received from the measurement device with a selected device under test to generate associated measurement data, and providing the associated measurement data to a service provider via a network.

In accordance with another aspect of the present disclosure, a system is provided for obtaining and maintaining maintenance records. The system includes a measurement device configured to measure at least one parameter of a device under test (DUT) and a computing device configured to be placed in communication with the measurement device. In some embodiments, the measurement device measures the at least one parameter of the device under test prior to or while coupled to the computing device. In other embodiments, the computing device is also configured to receive the at least one measured parameter from the measurement device and to associate the at least one measured parameter with the device under test to obtain at least one associated measured parameter. The system also includes a service provider in communication with the computing device. In some embodiments, the service provider is configured to receive the associated measured parameter and to store said associated measured parameter.

In accordance with another aspect of the present disclosure, a computer-readable storage medium is provided. The computer-readable storage medium includes instructions stored thereon that, in response to execution by a computing device, cause the computing device to (1) establish a data communication link between the computing device and the measurement device when the measurement device is in proximity; (2) receive measurement data from the measurement device, the measurement data being one or more measured parameters of a device under test (DUT); (3) associate the measurement data received from the measurement device with the device under test to generate associated measurement data; and (4) provide the associated measurement data to a service provider via a network.

In accordance with yet another aspect of the present disclosure, a method is provided. The method includes measuring at least one parameter of a device under test, transmitting the at least one measured parameter to a service provider, receiving measurement data that corresponds to the device under test from the service provider, and comparing the at least one measured parameter with the measurement data.

In accordance with another aspect of the present disclosure, a thermal imaging system is provided. The system includes a measurement device including an image sensor configured to obtain an image of a device under test, a display, a processor, a memory coupled to the processor, and a service provider interface stored in the memory and configured to be executed by the processor. In some embodiments, the service provider interface comprises: (1) an alignment module that, when executed by the processor, allows the image sensor to be substantially aligned with a reference image; and (2) an association module that when executed by the processor provides a list of selectable devices to the display, wherein the association module that when executed by the processor associates a selected device to the image to obtain an associated image. The system also includes a service provider in communication with the measurement device, wherein the service provider is configured to receive the associated image.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 11 is one example of a Connect devices interface in accordance with aspects of the present disclosure;

DETAILED DESCRIPTION

The following discussion provides examples of systems and techniques for obtaining and maintaining maintenance records for various assets. As will be described in more detail below, a computing device in one embodiment may be wirelessly coupled to a measurement device when the computing device is placed in proximity with the computing device. Upon measuring one or more parameters of a device under test (DUT), the measurement device may provide the measured parameter(s) to the computing device in the form of measurement data. In some embodiments, the computing device associates the measured parameters with the corresponding DUT from which the measurements were obtained and provides the associated measured parameter to, for example, a service provider for subsequent access. In another embodiment, the measurement device itself is configured to associate the measurement parameters with the DUT and provide the associated measurement parameters to the service provider.

Prior to discussing the details of various aspects of the present disclosure, it should be understood that one or more sections of the following description may be presented in terms of logic and operations that may be performed by conventional electronic components. These electronic components, which may be grouped in a single location or distributed over a wide area, generally include controllers, microcontrollers, control units, processors, microprocessors, etc. It will be appreciated by one skilled in the art that any logic described herein may be implemented in a variety of configurations, including but not limited to hardware, software, and combinations thereof. The hardware may include, but is not limited to, analog circuitry, digital circuitry, processing units, application specific integrated circuits (ASICs), and the like, and combinations thereof. In circumstances where the components are distributed, the components are accessible to each other via communication links.

While some embodiments have been illustrated and described, it will be appreciated that various changes can be made therein without departing from the spirit and scope of the disclosure. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Additionally, it will be appreciated that embodiments of the present disclosure may employ any combination of the features described herein.

Figure 1:
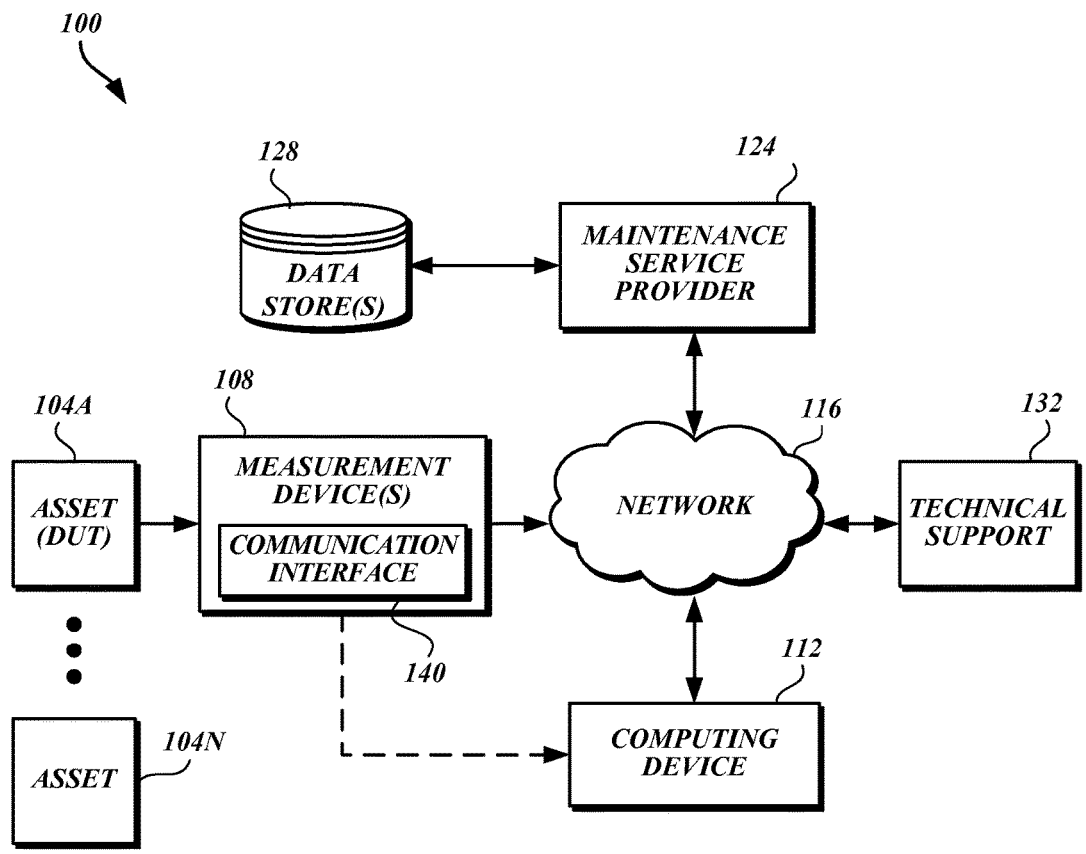
FIG. 1 is a block diagram of one example of a system for obtaining and maintaining maintenance records in accordance with aspects of the present disclosure.

FIG. 1 is a block diagram of a system 100 for obtaining and maintaining maintenance records in accordance with aspects of the present disclosure. The system 100 includes at least one asset 104 to be tested (also referred to herein as a device under test 104 or DUT 104) and one or more measurement devices 108 configured to measure one or more parameters of the DUT 104. For example, each of measurement devices 108 may include one or more sensors, probes, etc., for measuring one or more parameters of a DUT 104. It will be appreciated that the measurement device 108 may be installed in situ at the DUT 104 or may be brought to the DUT 104 by a user, such as a technician. The DUT 104 may include any equipment, device, circuit, structure, component, and the like having at least one parameter that can be tested by a measurement device. In some embodiments, the DUT 104 may include, but is not limited to, a pump, a motor, a transistor, a cable, a switch, a breaker, a generator, a transformer, a power storage source, etc. In a non-limiting example used throughout the disclosure, the DUT 104 includes an electric motor. The measurement device 108 may be a measurement and/or calibration device, including but not limited to a multimeter, oscilloscope, thermal imaging system, thermometer, calibration tool, cable tester, etc. In that regard, the one or more parameters to be measured by the DUT 104 may include electrical parameters, temperature, pressure, visible or invisible light waves (including images), and the like. In non-limiting examples used throughout the disclosure, the measurement devices 108 are a digital multimeter and a thermal imaging system.

The system 100 also includes at least one computing device 112 configured to be coupled in communication with the measurement device(s) 108. Each computing device 112 can be coupled in communication with the measurement device(s) 108 via any known or future developed wireless or wired communication protocols. In some embodiments, the computing device 112 and the measurement device(s) 108 can be configured to be coupled via Near Field protocols, Infrared protocols, Bluetooth protocols, IEEE 802 protocols, etc. As will explained in more detail below, the computing device 112 in one embodiment may be wirelessly coupled in communication with the measurement device 108 by placing the computing device 112 in proximity with the measurement device 108. In that regard, the computing device 112 is configured to receive data, such as measurement data, from the measurement device 108 via the wireless (or wired) communication link. In some embodiments, the computing device 112 may be, for example, a mobile computing device, such as a tablet or a smartphone, a personal computing device, a laptop computing device, a personal digital assistant, and the like.

The computing device 112 is also coupled in communication to a maintenance service provider 124 via a network 116 using any suitable wired and/or wireless communication protocol, including Internet, cellular and satellite protocols. The network 116 can be a Local Area Network (LAN), a large network, such as a Wide Area Network (WAN), or a collection of networks, such as the Internet. In that regard, the computing device 112 may be configured to provide measured data received from the measurement device 108 to the maintenance service provider 124 via the network 116. Similarly, the computing device 112 may be configured to receive data from the maintenance service provider 124 via the network 116. In one embodiment, the computing device 112 is configured to communicate with the measurement device 108 via the network 116 or other communication systems described herein. Although in the illustrated embodiment, the maintenance service provider 124 may be coupled to the computing device 112 via the same network 116 by which the measurement device 108 is coupled to the computing device 112, it is to be appreciated that the network coupling the computing device 112 to the maintenance service provider 124 may be distinct from the network coupling the computing device 112 to the measurement device 108.

Generally described, the maintenance service provider 124 may include one or more interconnected computing devices (not shown), such as personal computers, server computers, embedded computing devices, mobile computing devices, and the like. It is to be appreciated that each of the computing devices may include a variety of hardware components and program modules for operation, which will not be described herein in detail in the interest of brevity. The maintenance service provider 124 may further include or be coupled to one or more data stores 128 for storing data, such as the measurement data received from the computing device 112.

In the illustrated embodiment, the maintenance service provider 124 and the computing device 112 are further coupled to technical support 132 via the network 116. The maintenance service provider 124 may be configured to initiate contact with technical support 132 and provide suitable information to allow technical support 132 to be placed in communication with the computing device 112. For instance, technical support 132 may be configured to send texts or emails to the computing device 112 via the network 116 in response to a request from the maintenance service provider 124. It is to be appreciated that technical support 132 is optional. In some embodiments, technical support 132 may also be integrated with the maintenance service provider 124.

Figure 2:
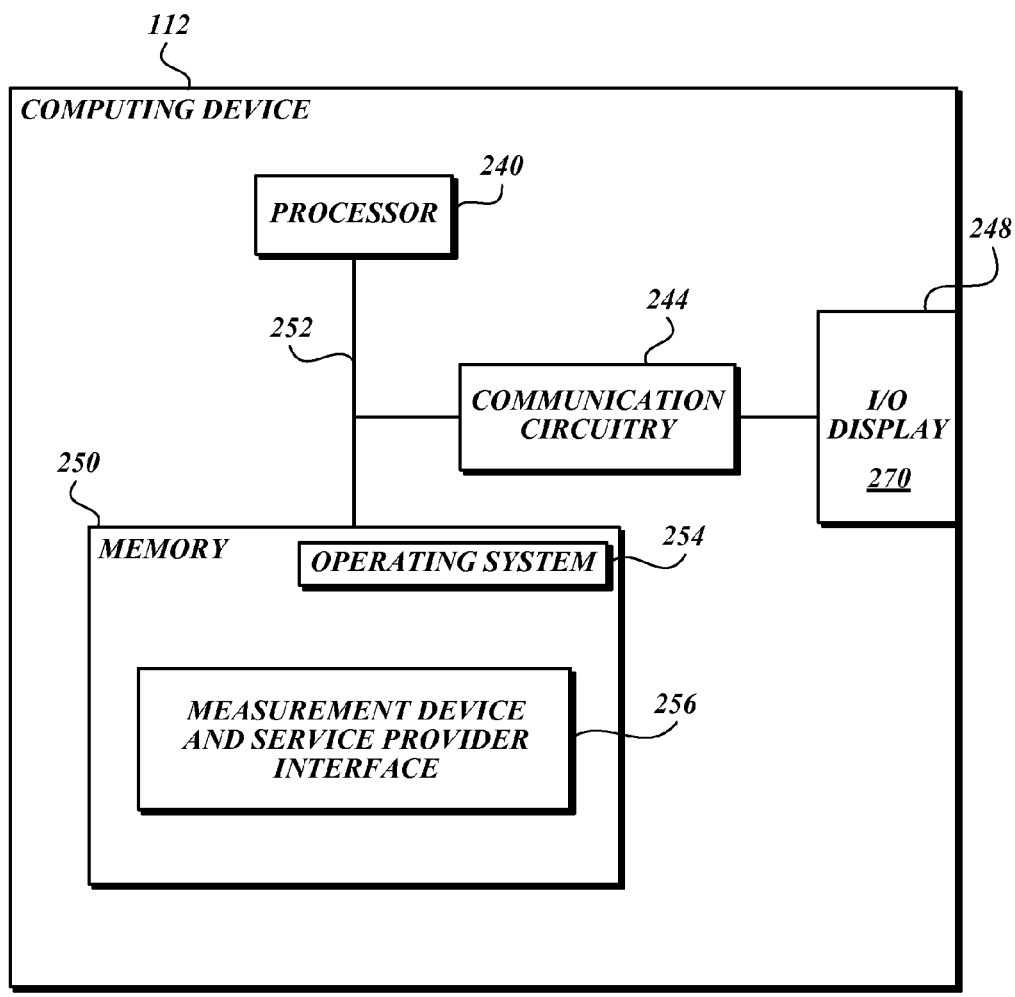
FIG. 2 is a block diagram of one example of a computing device in accordance with aspects of the present disclosure.

Turning now to FIG. 2, there is shown a block diagram of a representative component architecture of one example of a computing device 112. The computing device 112 includes hardware components, such as a central processing unit (CPU) or processor 240, communication circuitry 244, I/O interface 248, and memory 250 suitably interconnected via one or more buses 252. Depending on the exact configuration and type of computing device, the memory 250 may include system memory in the form of volatile or nonvolatile memory, such as read only memory ("ROM"), random access memory ("RAM"), EEPROM, flash memory, or similar memory technology. Those of ordinary skill in the art and others will recognize that system memory typically stores data and/or program modules that are immediately accessible to and/or currently being operated on by the processor 240. In this regard, the processor 240 serves as a computational center of the computing device 112 by supporting the execution of instructions.

The memory 250 may also include storage memory. The storage memory may be any volatile or nonvolatile, removable or non-removable memory, implemented using any technology capable of storing information. Examples of storage memory include but are not limited to a hard drive, solid state drive, CD ROM, DVD, or other disk storage, magnetic cassettes, magnetic tape, magnetic disk storage, and the like. The information stored in the storage memory includes, but is not limited to, program modules and data to be accessed by the processor 240. Generally, program modules may include routines, applications, objects, components, data structures, etc., that perform particular tasks or implement particular abstract data types. It will be appreciated that system memory and storage memory described herein are merely examples of computer readable storage media.

In the embodiment shown in FIG. 2, the memory 250 stores an operating system 254 for controlling the operation of the computing device 112. In one embodiment of the disclosure, the operating system 254 provides a graphical operating environment, such as Microsoft Corporation's WINDOWS® or WINDOWS® Mobile, LINUX, Google's Android, Blackberry OS, or Apple's Leopard or mobile iOS graphical operating system, etc., in which activated applications or program modules are represented as one or more graphical application windows with an interface visible to the user, such as a graphical user interface (GUI). To interact with the computing device 112, the input/output interface 248 may include a variety of components that enable the computing device 112 to obtain inputs from and provide outputs to a user and/or other devices. The input/output interface 248 may include, but is not limited to, a display, such as an LCD, an LPD, OLED display, etc., a keypad, hard or soft keyboards, a touchpad, controls, physical buttons, scroll wheels, a digital pen, trackballs, a joystick, etc. In one embodiment, the display, such as display 270, may be configured as a touchscreen. The I/O interface 248 also receives input from, and in some embodiments may provide output to, the measurement device(s) 108.

The memory 250 also stores a measurement device and service provider interface 256 that when executed by the processor 240, provides functionality to the computing device 112. Such functionality may include, but is not limited to, interactions with one or more measurement devices 108, receiving measurement data from the measurement device 108, sending and receiving data, such as measurement data and historical data, to/from the maintenance service provider 124, associating measurement data with a particular DUT 104, obtaining a maintenance route for obtaining measurement data from a plurality of DUTs 104, etc. To that end, the interface 256 may include one or more applications or program modules, which can be written in a programming language, such as C, C++, COBOL, JAVA™, PHP, Perl, HTML, CSS, JavaScript, VBScript, ASPX, Microsoft .NET™ languages such as C#, and/or the like. It will be appreciated that the functionality of the service provider interface 256 may be split among multiple program modules or sub-modules. As will be described in more detail below, execution of the interface 256 by the processor 240 in some embodiments generates one or more user interfaces having one or more interface elements. In some embodiments, the one or more user interfaces are presented to the user via the display 270 in a hierarchal manner.

Still referring to FIG. 2, the communication circuitry 244 comprises one or more components for communicating either directly with measurement device 108 or indirectly with the measurement device 108 over network 116 using any suitable wired or wireless communication protocols. The one or more components of the communication circuitry 244 may also be employed to communicate with the maintenance service provider 124 and/or technical support 132, etc. The components may include modems, transmitter/receiver and/or transceiver circuitry, for performing communications over the one or more networks. To communicate wirelessly, the communication circuitry 244 may include one or more suitable antennas (not shown). For ease of illustration, FIG. 2 does not depict analog to digital converters, digital to analog converters, amplifiers, device controllers, etc., which will typically be included with the communication circuitry. However, since these and other components that may be included with the communication circuitry are known in the art, they will not be described in detail here.

The functionality of the interface 256 will now be described in more detail. In some embodiments, the interface 256 allows the computing device 112 to be wirelessly coupled to a measurement device 108 (FIG. 1) when the computing device 112 is placed in proximity with the measurement device 108. In that regard, the measurement device(s) 108 includes a communication interface 140, including a transmitter, a transceiver, and/or the like, configured to couple with the computing device 112 and to transmit signals thereto. When the computing device 112 is in proximity with the measurement device 108, the interface 256 causes the communication circuitry 244 to perform a coupling process or "handshake" so that the computing device 112 is capable of receiving one or more signals from the measurement device 108, thereby associating the computing device 112 with the measurement device 108. The coupling process can be automatic or user initiated via a switch, graphical user interface element, or the like. In one non-limiting embodiment, the computing device 112 and the measurement device 108 are configured to be paired via Bluetooth® and/or the like.

Once coupled, the computing device 112 may be configured, by way of interface 256, to receive measurement data from the measurement device 108. The measurement data may be provided from the measurement device 108 to the computing device 112 via wireless communication established by placing the computing device 112 in proximity with the measurement device 108, by network 116, or over another communication network. In particular, the measurement device 108 is configured to provide measurement data or other data generated by the measurement device 108 to the computing device 112. Although only one computing device and one measurement device are shown, it is to be appreciated that a plurality of computing devices may be configured to associate with a plurality of measurement devices.

The interface 256 also allows the computing device 112 to communicate with the maintenance service provider 124 via the network 116. In that regard, the maintenance service provider 124 may be configured to send data to and receive data from the computing device 112. By way of the interface 256, the computing device 112 may be further configured to access a help service and a maintenance library stored in the data store 128 of the maintenance service provider 124. The maintenance library may include maintenance data, such as a taxonomy of assets, measurement data, reference data, maintenance operator comments, high priority measurements needed, common asset problems, etc.

As understood by one of ordinary skill in the art, a "data store" as described herein may be any suitable device configured to store data for access by a computing device. One example of a data store is a highly reliable, high-speed relational database management system (DBMS) executing on one or more computing devices and accessible over a high-speed packet switched network. However, any other suitable storage technique and/or device capable of quickly and reliably providing the stored data in response to queries may be used, and the computing device may be accessible locally instead of over a network, or may be accessible over some other type of suitable network or provided as a cloud-based service. A data store may also include data stored in an organized manner on a storage medium known in the art. One of ordinary skill in the art will recognize that any separate data stores described herein may be combined into a single data store, and/or any single data store described herein may be separated into multiple data stores, without departing from the scope of the present disclosure.

The interface 256 further allows for the manipulation of data received from the measurement device 108 and the maintenance service provider 124, as well as to create records. For instance, the interface 256 may be configured to create, and in some embodiments, edit and store records for various DUTs 104A-N. The created records may include asset name, asset type, measurement data received from a particular measurement device, time of service, comments from the maintenance staff, and other information related to maintaining the assets. The created records may be provided to the maintenance service provider 124 for storage in the data store 128. Additionally, the interface 256 may be configured to access previously stored records for various assets stored in the data store 128 of the maintenance service provider 124 and transmitted to the computing device 112. The stored records can be downloaded by the computing device 112 or streamed to the computing device 112. In such an instance, the computing device 112 may also include audio/video converters/decoders and/or other device appropriate circuitry and/or software in order to view streaming data from the maintenance service provider 124. The stored records may include analyzed data from a plurality of stored records, such as historical measurement data, trends, reference data, and the like. In some embodiments, the interface 256 may be further configured to edit previously stored records for various assets stored in the data store 128 of the maintenance service provider 124.

The interface 256 may also allow a user to associate measurement data received from the measurement device 108 with the DUT 104 from which the measurement data was obtained. To that end, the interface 256 may provide a graphical list of a plurality of assets which a user may select as the DUT. In some embodiments, each asset is associated with an asset record in the memory 250 of the computing device 112 or stored in the data store 128 of the maintenance service provider 124. The asset record may include information, such as asset type, name, location, serial number, and route. In one embodiment, the list of the plurality of assets comprises a list of assets in a particular location. Accordingly, measurement data may be associated with the DUT (i.e., the asset which the measurement data was obtained) by selecting one of the assets from the list or by selecting an asset record. In other embodiments, the measurement data may be associated with the DUT 104 from data obtained by an automated system 274, such as barcode scanners, optical character recognition, RFID, and the like. In some embodiments, the computing device 112 includes such automation systems, and in other embodiments, the automated systems are coupled to the computing device 112 via suitable wireless or wired communication protocols.

In some embodiments, the measurement data can be associated with the DUT 104 prior to the computing device 112 receiving measurement data from the measurement device 108. For example, an asset record corresponding to the DUT may be selected or created prior to receiving the measurement data from the measurement device 108, thereby associating the subsequently received measurement data with the DUT 104. In other embodiments, the measurement data is to be associated with the asset 104 after receiving the measurement data from the measurement device 108. For instance, upon receiving measurement data, the associated asset record may be created, selected, etc., thereby associating the received measurement data with the DUT 104.

Figure 20:
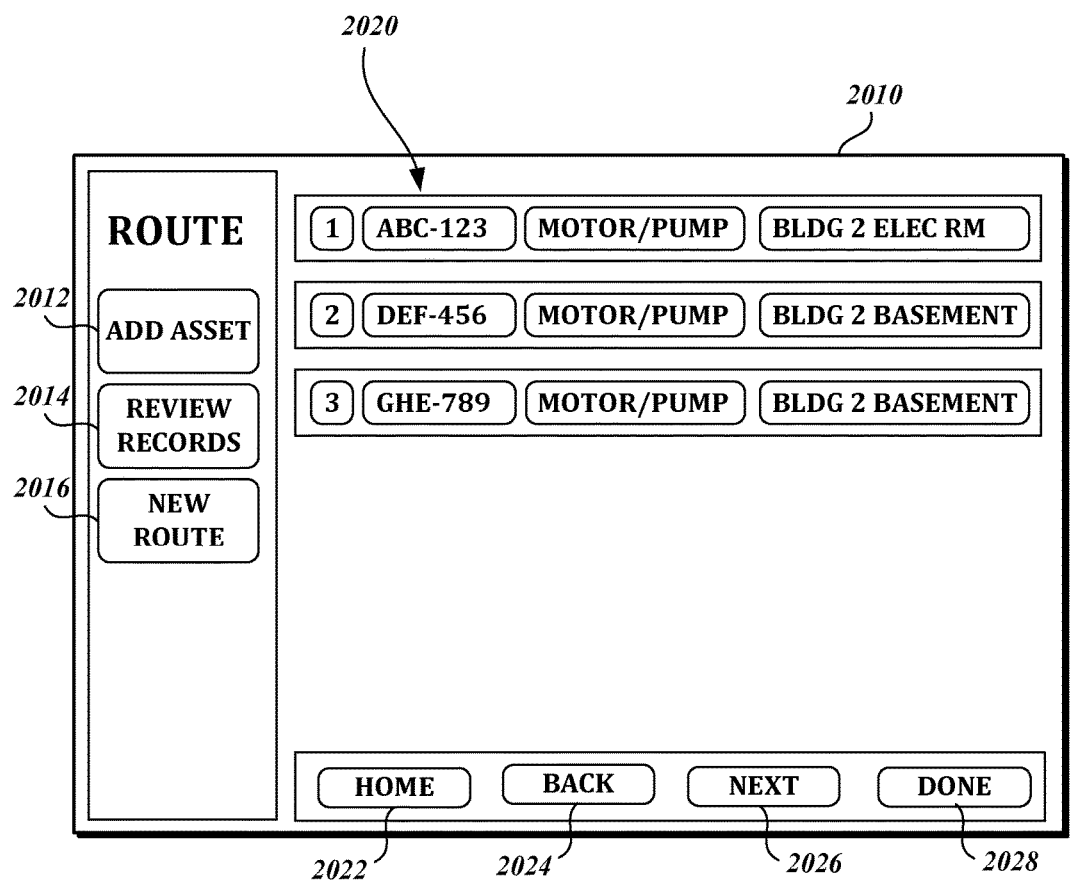
FIG. 20 is one example of a Connect devices interface in accordance with aspects of the present disclosure.

The interface 256 may further provide a graphical list of assets to be tested (DUTs 104). In particular, the interface 256 may provide the identity and/or location of each of the assets on the list. For instance, the interface 256 may include a graphical map illustrating each asset to be tested in a particular environment. In some embodiments, the interface 256 may further indicate the order in which each asset is to be tested. FIG. 20 is a representative interface illustrating one example of a maintenance route, as will be described in more detail below.

Figure 5:
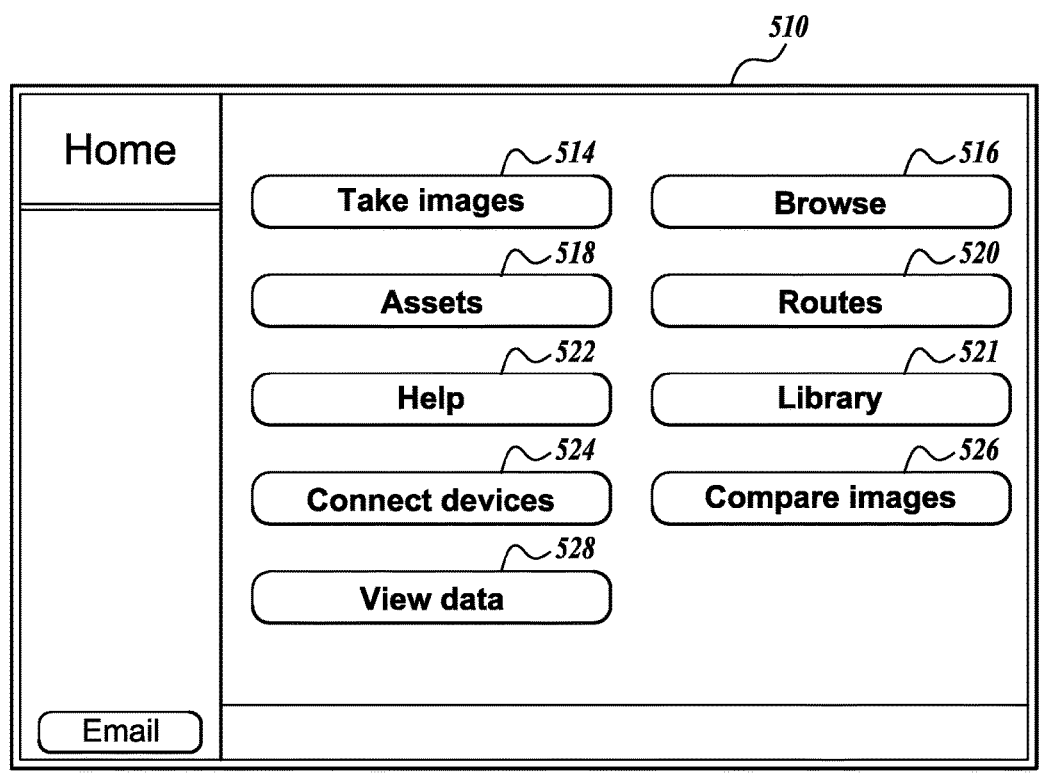
FIG. 5 is one example of a navigation interface in accordance with aspects of the present disclosure.

As briefly described above, one or more embodiments of the interface 256 are capable of generating one or more interfaces for presentation to a user, such as a technician or the like. In some embodiments, execution of the interface 256 presents a navigation interface 510 on the display 270 (see FIG. 2). One example of the navigation interface is shown in FIG. 5. The navigation interface 510 may combine multiple types of information to provide an integrated view of data stored and data to be collected within the system 100 in an organized and efficient manner. The navigation interface 510 may provide functionality that guides the user through activities related to maintenance or calibration information obtained and maintained by the system 100.

In the embodiment of FIG. 5, the navigation interface 510 includes a plurality of interface elements, such as icons, hyperlinks, etc. The interface elements in one embodiment may include one or more of the following in any combination: Take images interface element 514; Browse interface element 516; Assets interface element 518; Routes interface element 520; Help interface element 522, Library interface element 521; Connect devices interface element 524; Compare images interface element 526; View data interface element 528; among others. Upon execution of one of the interface elements, another associated interface is presented via the display for interaction with the user.

Figure 6:
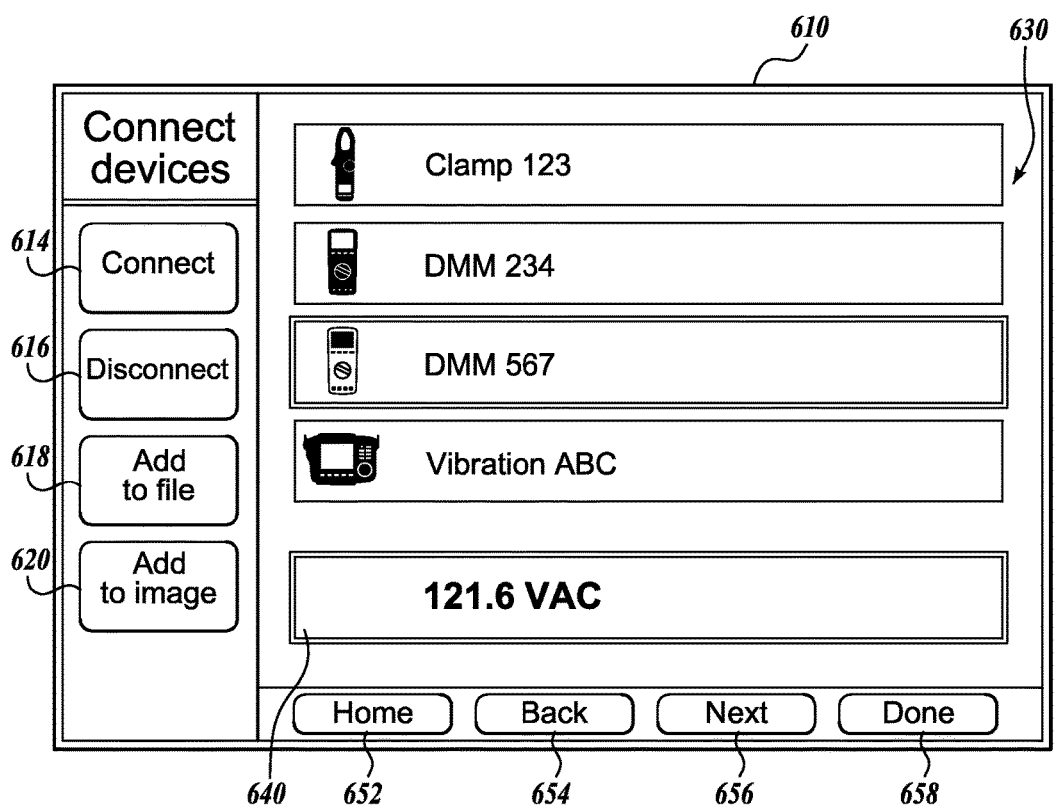
FIG. 6 is one example of a Connect devices interface in accordance with aspects of the present disclosure.

FIGS. 6-20 depict examples of other associated interfaces that may be presented via the display for interaction with the user. FIG. 6 is one example of a Connect devices interface 610 that is generated by the interface 256 and presented to the user via the display 270 upon actuation of, for example, the Connect devices interface element 524 in FIG. 5. As best shown in FIG. 6, the Connect devices interface 610 includes interface elements that include, for example, a Connect interface element 614, a Disconnect interface element 616, an Add to file interface element 618, an Add to image interface element 620, etc. In one embodiment, actuation of the Connect interface element 614 causes the communication circuitry 244 to perform a coupling process or "handshake" so that the computing device 112 is capable of receiving one or more signals from a measurement device, such as measurement device 108, that is in proximity of the computing device 112. Once coupled, the computing device 112 is associated with the measurement device 108.

In other embodiments, the Connect devices interface 610 may also include a list 630 of one or more measurement devices that can be selected by the user for the coupling process. The list 630 can be in depicted as words, icons, combinations thereof, etc. In some embodiments, the list 630 may be historically generated, a list pre-stored in memory 250, the previous, for example, four (4) coupled measurement devices, or the list may be a list of all of the measurement devices that are in proximity of the computing device 112 and are capable of being coupled thereto. The Connect devices interface 610 may further depict the one or more signals indicative of measurement data received from a measurement device in a graphical manner as indicated at 640. The Connect devices interface 610 may also include navigational interface elements that include, for example, a Home interface element 652, a Back interface element 654, a Next interface element 656, a Done interface element 658, etc.

Figure 7A:
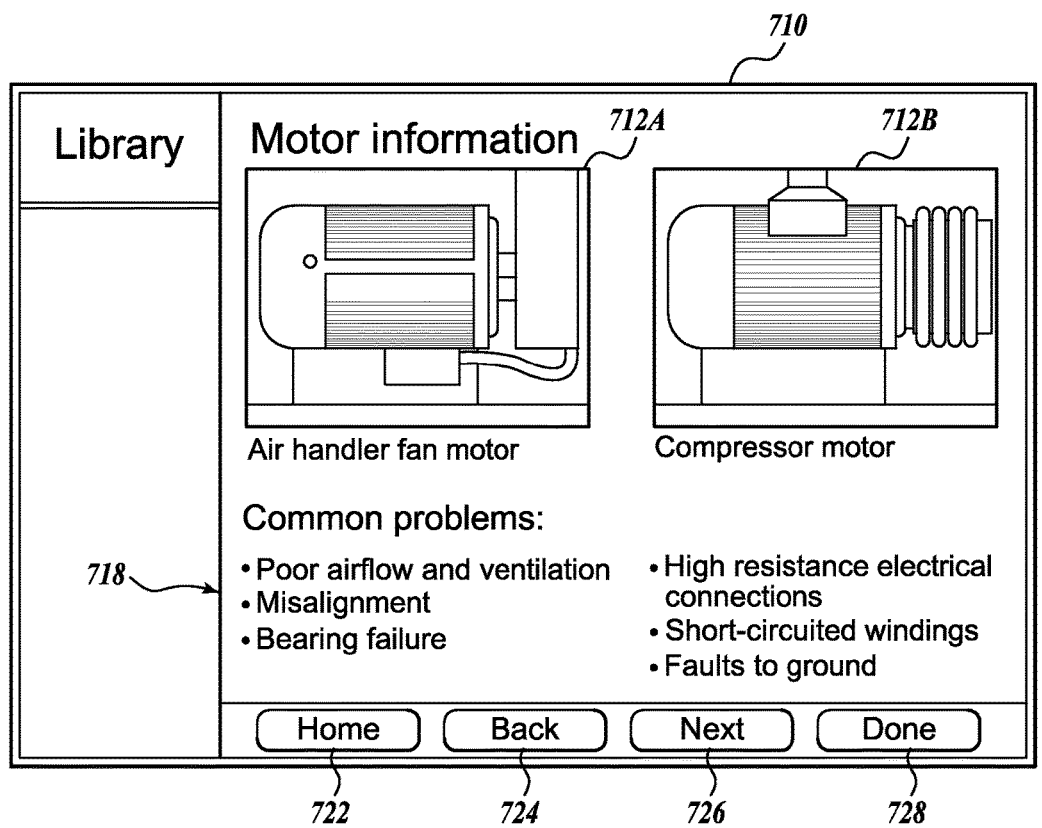
FIG. 7A is one example of a Library interface in accordance with aspects of the present disclosure.

FIG. 7A is one example of a Library interface 710 that is generated by the interface 256 and presented to the user via the display 270 upon actuation of, for example, the Library interface element 521 in FIG. 5. As best shown in FIG. 7A, among other things, the Library interface 710 may include one or more images 712A-N of a DUT, such as an electric motor, and/or information 718 in the form of text, etc., of the asset in question, and/or the like. In the example shown in FIG. 7, the information may include common maintenance problems with the DUT, general service or testing information, normal operational parameters of the DUT, etc. The Library interface 710 also includes navigational interface elements that include, for example, Home interface element 722, Back interface element 724, Next interface element 726, Done interface element 728, etc.

Figure 7B:
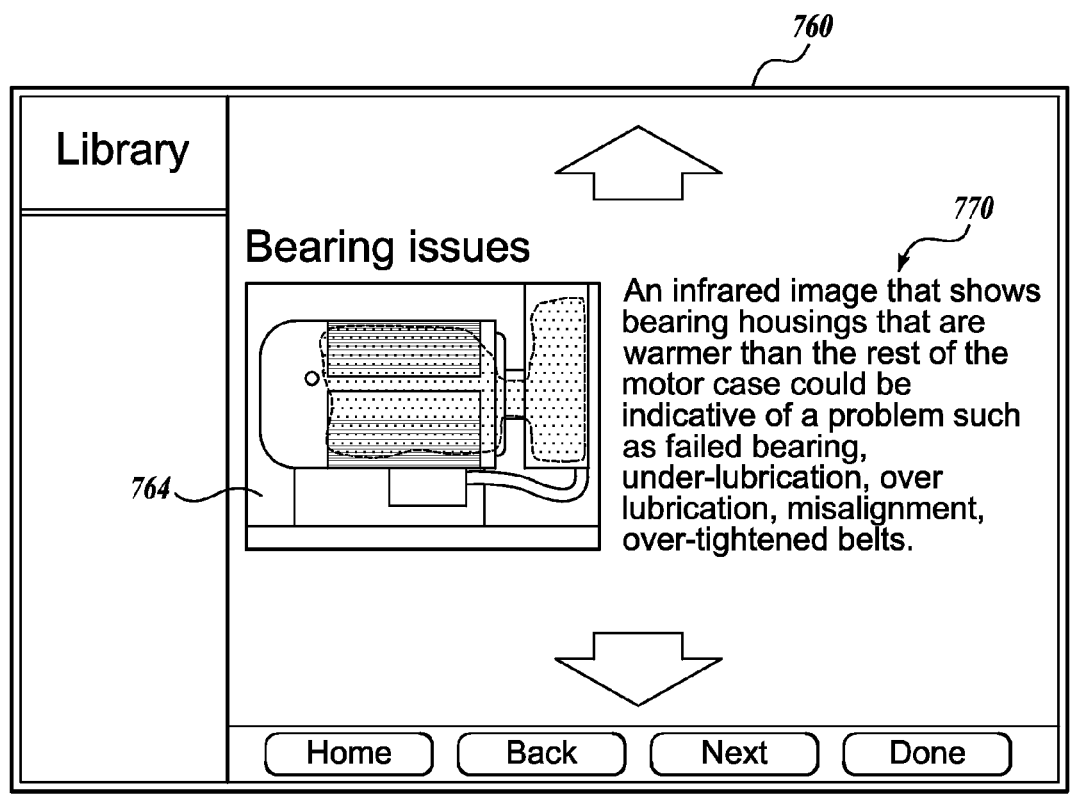
FIG. 7B is another example of a Library interface in accordance with aspects of the present disclosure.

FIG. 7B is another example of a Library interface 760 that is generated by the interface 256 and presented to the user via the display 270. The Library interface 760 may be generated upon actuation of, for example, the Library interface element 521 in FIG. 5, actuation of other interface elements, such as the Next interface element 726 (see FIG. 7A), among others. In any case, the Library interface 760 may include one or more images 764A-N of an asset, such as an electric motor, and/or information 770 in the form of text, etc., of the asset in question, and/or the like. In the example shown in FIG. 7B, the information 770 may be in the form of maintenance issues common to the DUT, although other information may be alternatively or additional presented.

Figure 8:
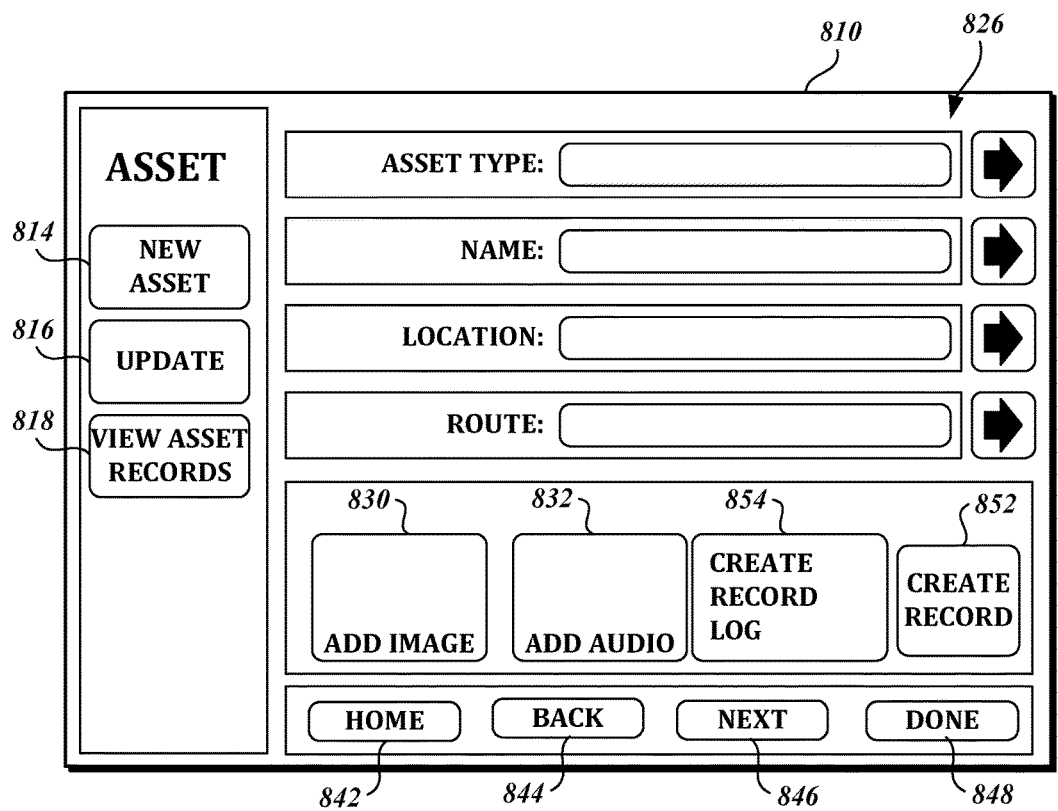
FIG. 8 is one example of an Asset interface in accordance with aspects of the present disclosure.
Figure 12:
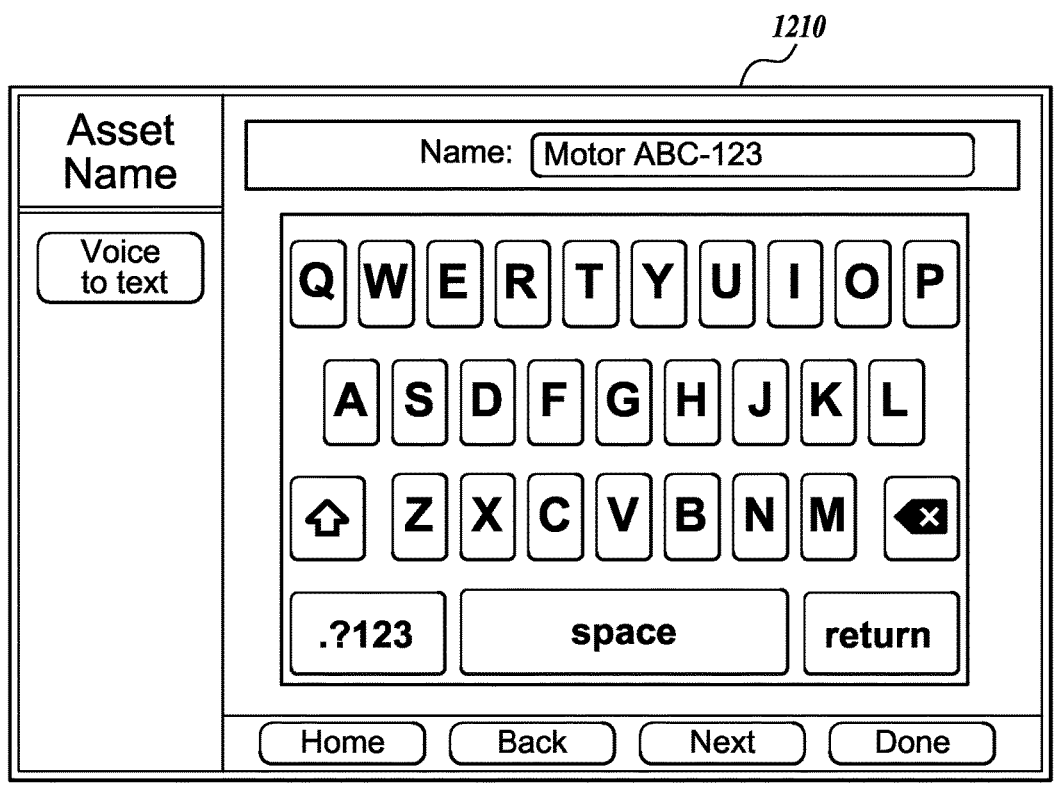
FIG. 12 is one example of a Connect devices interface in accordance with aspects of the present disclosure.
Figure 13:
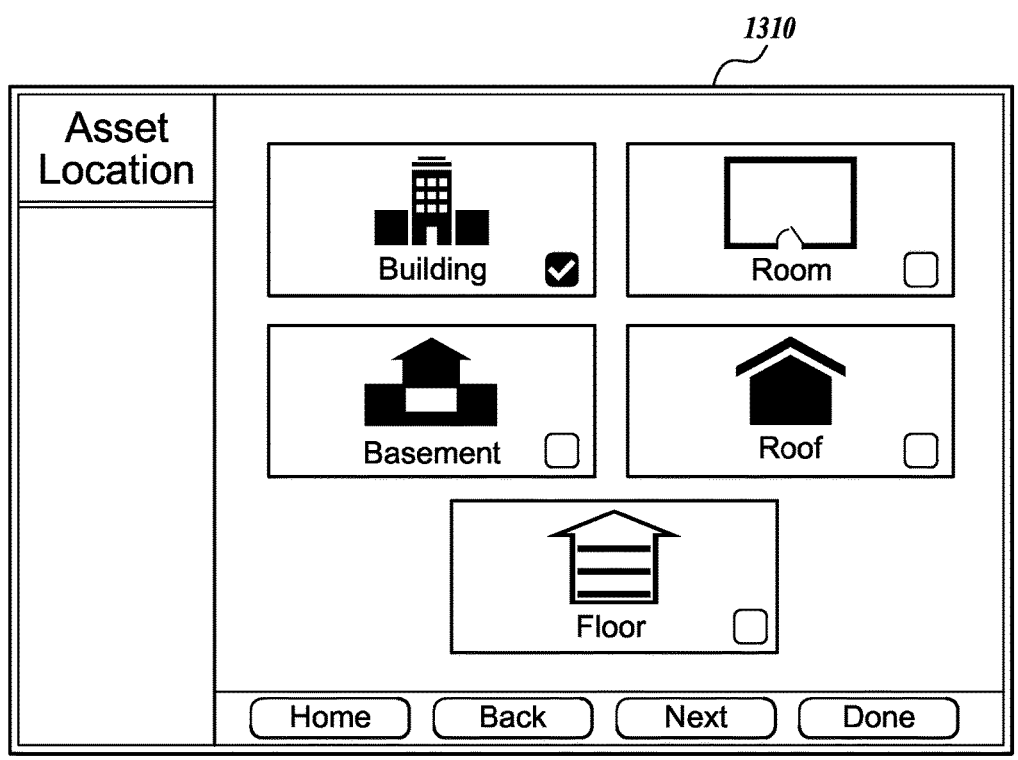
FIG. 13 is one example of a Connect devices interface in accordance with aspects of the present disclosure.

FIG. 8 is one example of an Assets interface 810 that is generated by the interface 256 and presented to the user via the display 270 upon actuation of, for example, the Assets interface element 518 in FIG. 5. As best shown in FIG. 8, the Assets interface 810 comprises interface elements that include, for example, New Asset interface element 814, Update interface element 816, View Asset Records interface element 818, among others. The Assets interface 810 also provides data entry elements 826 that allow the user to enter information regarding the asset, or DUT. In the embodiment shown, the information may include, but is not limited to, asset type, name, location, route, etc. It will be appreciated that the information can be entered via a pull down menu, a browse menu, etc., that is generated from information stored on the computing device 112 or accessed from the service provider 124. In other embodiments, the information may be entered via one or more alternative or additional interfaces for entry of such DUT information. For example, an asset type may be entered via an Asset Type interface 1110, an example of which is shown in FIG. 11, an asset name may be entered via an Asset Name interface 1210, an example of which is shown in FIG. 12, and an asset location may be entered via an Asset Location interface 1310, an example of which is shown in FIG. 13.

Returning to FIG. 8, the Assets interface 810 may include other interface elements that allow an image, audio file, etc., to be added or associated with the asset in an asset record.

Further, the Assets interface 810 may include navigational interface elements that include, for example, a Home interface element 842, a Back interface element 844, a Next interface element 846, a Done interface element 848, etc.

Figure 9:
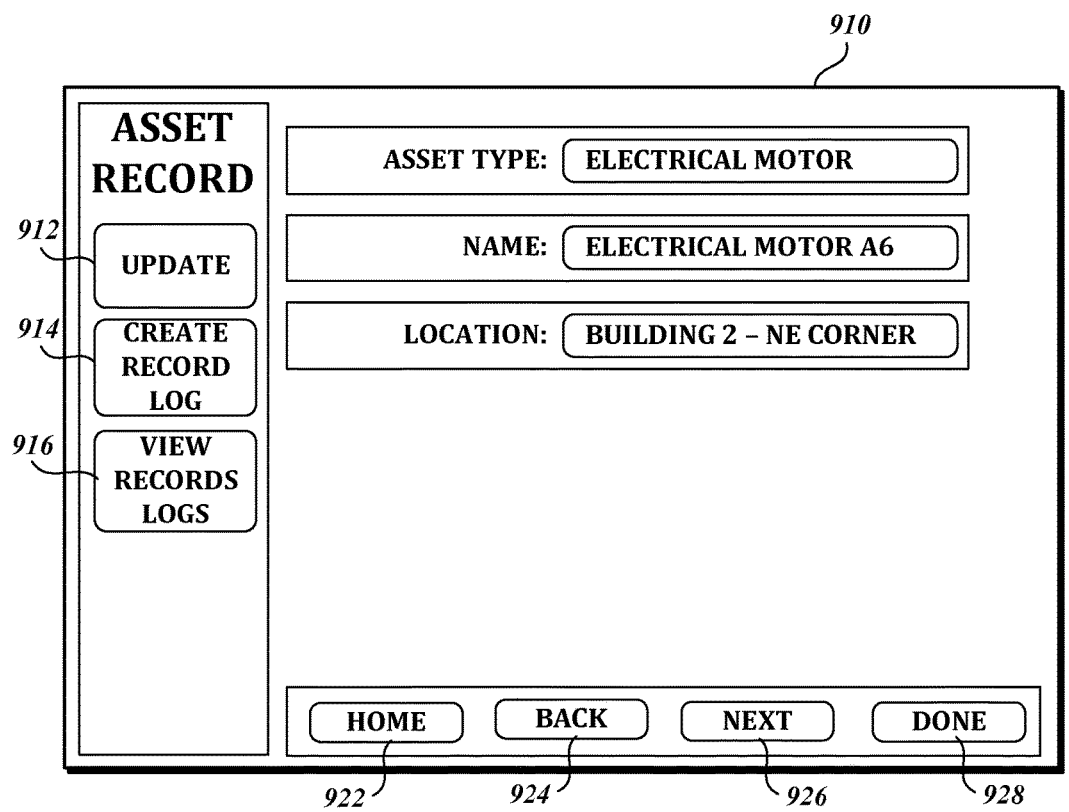
FIG. 9 is one example of a Connect devices interface in accordance with aspects of the present disclosure.

In the embodiment shown in FIG. 8, the Assets interface 810 may also include a Create Record interface element 852. Upon actuation of, for example, the Create Record interface element 852, an Asset record interface 910 is generated, one example of which is shown in FIG. 9. The Asset record interface 910 displays information regarding the asset, or DUT, such as asset type, asset name, asset location, etc. As best shown in FIG. 9, among other things, the Asset record interface 910 may include interface elements that allow for updating or editing the asset record, for creating a record log, for viewing record logs, among other things. In that regard, the Asset record interface 910 may include an Update interface element 912, a Create record interface element 914, a View record logs interface element 916, etc.

Figure 10:
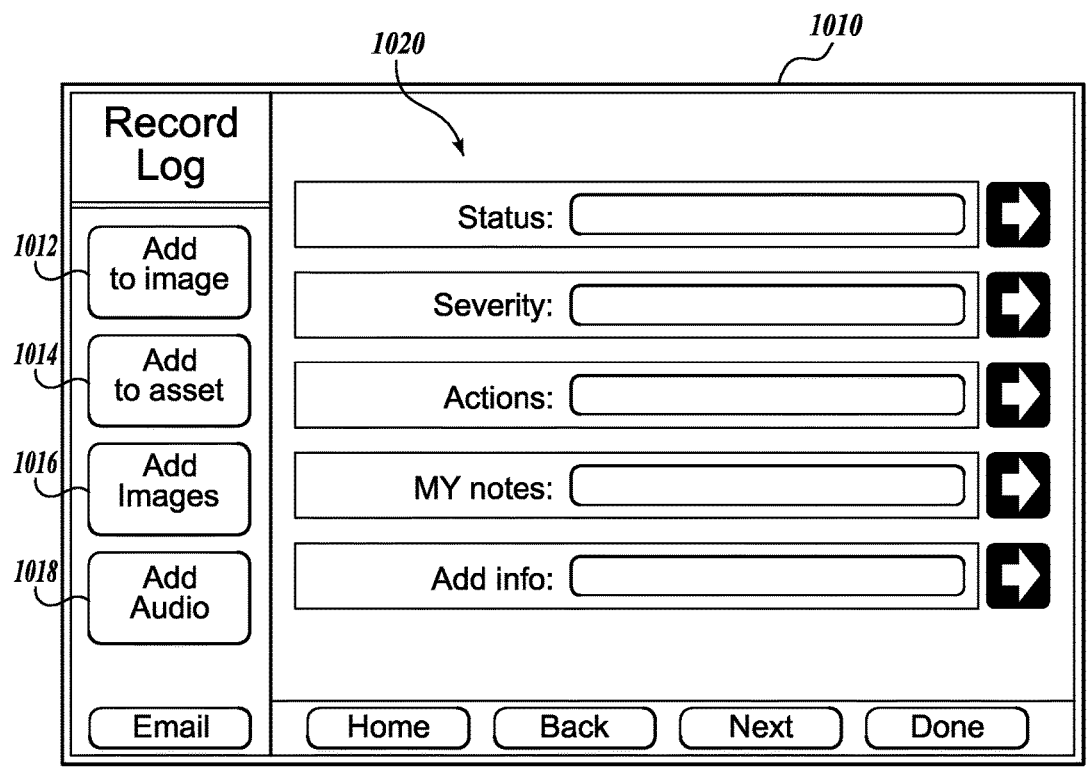
FIG. 10 is one example of a Connect devices interface in accordance with aspects of the present disclosure.

Further in the embodiment shown in FIG. 8, the Assets interface 810 may additionally or alternatively include a Create Record Log interface element 854. Upon actuation of, for example, the Create Record Log interface element 854 of FIG. 8, the Create Record Log interface element 914 of FIG. 9, etc., a Record Log interface 1010 is generated, one example of which is shown in FIG. 10. As best shown in FIG. 10, among other things, the Asset record interface 910 may provide data entry elements 1026 that allow the user to enter testing information regarding the asset, or DUT, and associate the information thereto. In the embodiment shown, the information may include, but is not limited to, status of the DUT, severity of the problem, any actions that need to be taken, any notes that need to be documented, any additional information that may be helpful to another technician, etc. It will be appreciated that the information can be entered via a pull down menu, a browse menu, etc., that is generated from information stored on the computing device 112 or accessed from the service provider 124. In other embodiments, input devices, such as a touchscreen keyboard, a soft or hard keyboard, etc., may be used to enter the information. Other forms of information (e.g., images, audio files, etc.) may also be entered into the Record Log interface 1010 via interface elements, such as an Add images interface element 1016 or an Add audio interface 1018. Once the information as been entered into the Record Log interface 1010, the information can be added in some embodiments to an image, added to an asset, etc., via actuation of an Add to image interface element 1012, an Add to asset interface element 1014, and/or the like.

Figure 14:
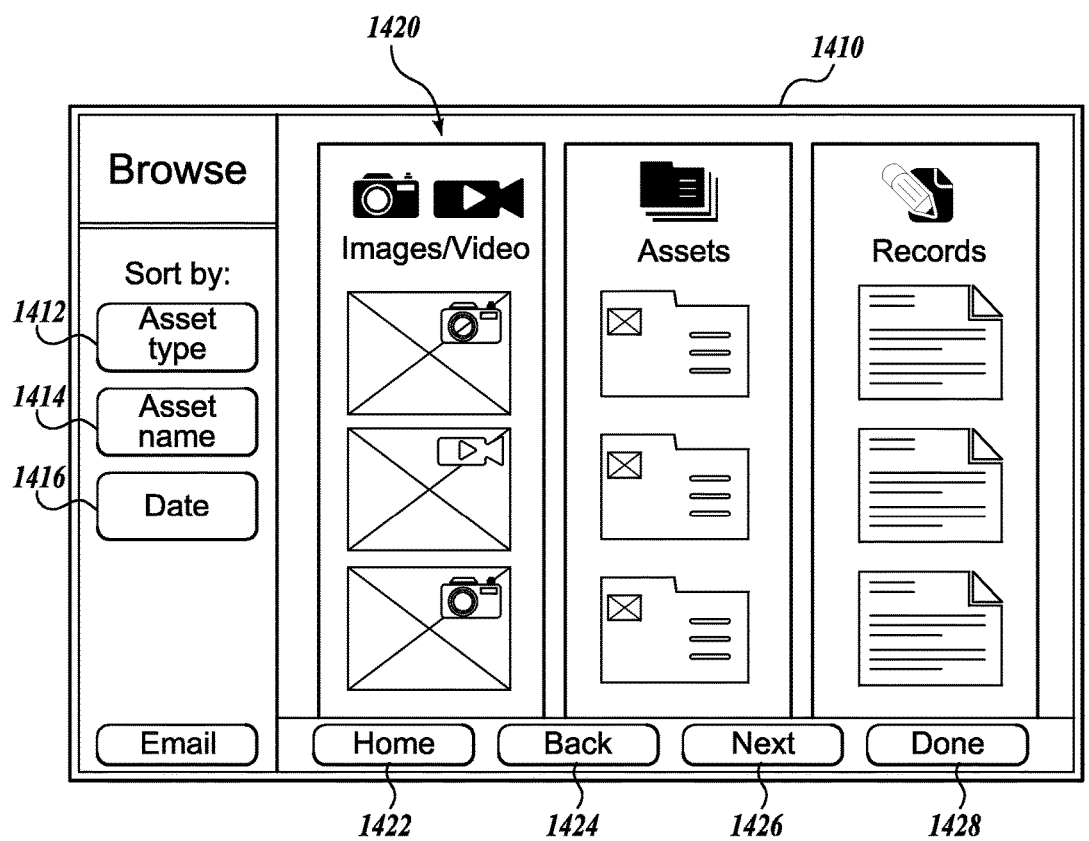
FIG. 14 is one example of a Connect devices interface in accordance with aspects of the present disclosure.

FIG. 14 is one example of a Browse interface 1410 that is generated by the interface 256 and presented to the user via the display 270 upon actuation of, for example, the Browse interface element 516 in FIG. 5. As best shown in FIG. 14, the Browse interface 1410 comprises interface elements that allow the user to locate information either stored on the computing device or in the one or more data stores of the maintenance service provider 124 regarding an asset, such as DUT 104. Locating information may occur by sorting the information by information type. For example, the Browse interface 1410 may sort the information by asset type, asset name, etc. In that regard, the Browse interface elements may include an Asset type interface element 1412, an Asset name interface element 1414, a Date interface element 1416, among others. As best shown in FIG. 14, among other things, the Browse interface 1410 may also include information 1420 in the form of one or more images, one or more assets, one or more records, etc., for selection by the user. In the example shown in FIG. 14, the information 1420 can be categorized into columns of one or more images, one or more assets, one or more records, etc. The Browse interface may further include navigational interface elements that include, for example, a Home interface element 1422, a Back interface element 1424, a Next interface element 1426, a Done interface element 1428, etc.

Figure 15:
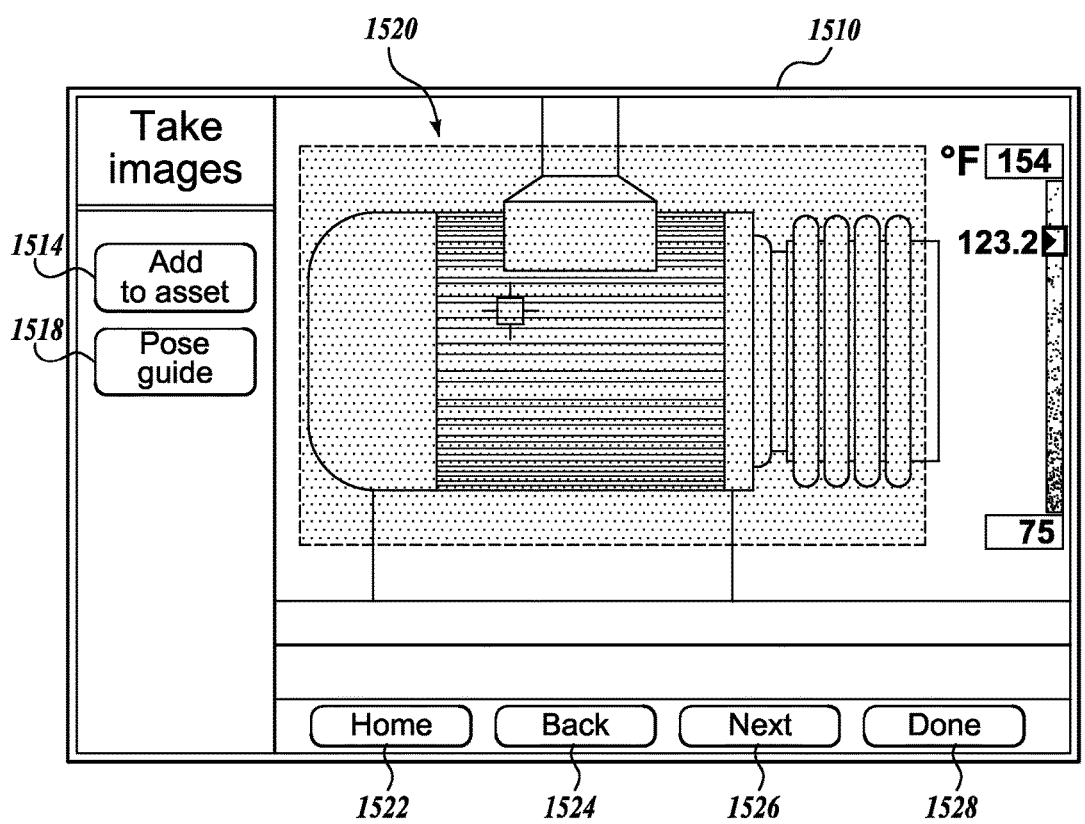
FIG. 15 is one example of a Connect devices interface in accordance with aspects of the present disclosure.

FIG. 15 is one example of a Take Image interface 1510 that is generated by the interface 256 and presented to the user via the display 270 upon actuation of, for example, the Take Image interface element 514 in FIG. 5. As best shown in FIG. 15, the Take Image interface 1510 comprises interface elements that allow the user to obtain images from an associated measurement device, such as a thermal imaging system, digital camera, digital video recorder, etc., and associate them with an asset, such as DUT 104. In that regard, the Take Image interface elements may include an Add to asset interface element 1514, among others. As best shown in FIG. 15, among other things, the Take Image interface 1510 may also include information 1520 in the form of one or more images, for viewing by the user. The Take Image interface 1510 may also include navigational interface elements that include, for example, a Home interface element 1522, a Back interface element 1524, a Next interface element 1526, a Done interface element 1528, etc.

Figure 16:
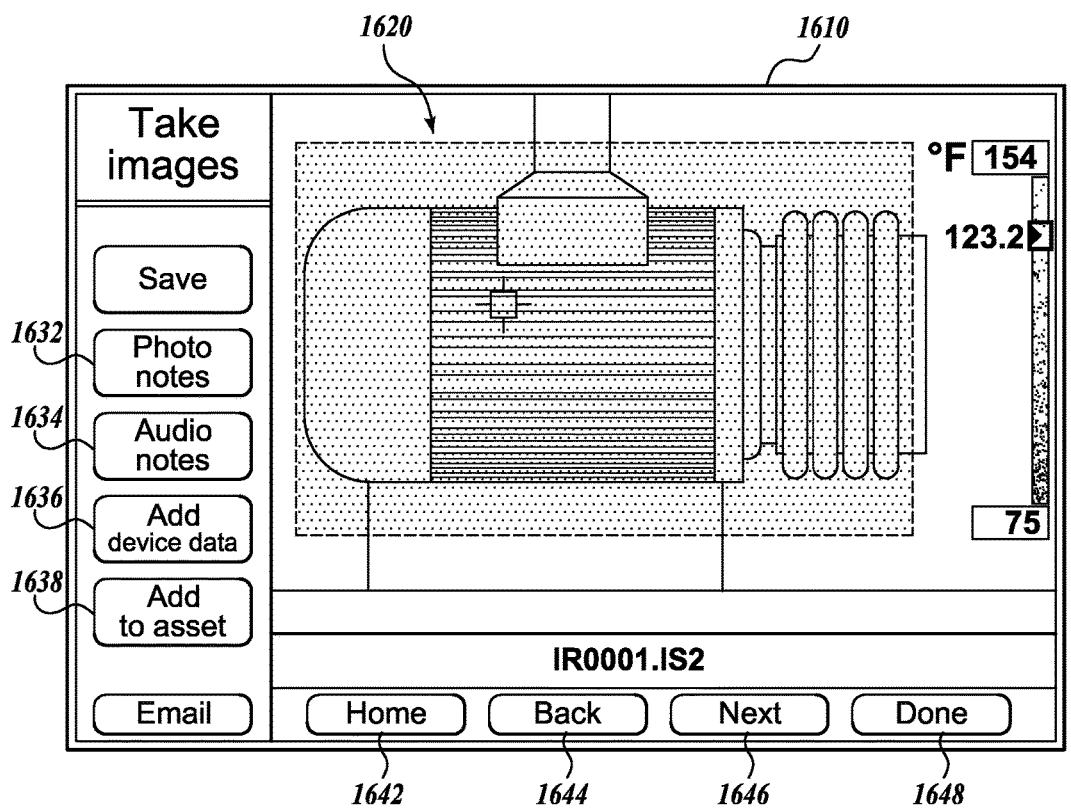
FIG. 16 is one example of a Connect devices interface in accordance with aspects of the present disclosure.

FIG. 16 is another example of a Take Image interface 1610. The Take image interface 1610 can be generated by the interface 256 and presented to the user via the display 270 upon actuation of, for example, the Take Image interface element 514 in FIG. 5, by actuation of the Next interface element 1526 of FIG. 15, among others. As best shown in FIG. 16, among other things, the Take Image interface 1610 may include information 1620 in the form of one or more images, for viewing by the user. In one embodiment, the image shown corresponds to an image of a DUT taken by a measurement device and received from such a measurement device, such as DUT 104, that has been or will be coupled to the computing device by the coupling process described herein.

As best shown in FIG. 16, the Take Image interface 1610 also comprises interface elements that allow the user to associate the images with an asset, such as DUT 104. In that regard, the Take Image interface elements may include an Add to asset interface element 1630, among others. The Take Image interface 1610 may also allow for the inclusion of text notes, audio notes, etc., and the ability to add device data. In that regard, the Take Images interface 1610 may also include a Photo notes interface element 1632, an Audio notes interface element 1634, an Add device data interface element 1636, among others. The Take Image interface 1610 may further include navigational interface elements that include, for example, a Home interface element 1642, a Back interface element 1644, a Next interface element 1646, a Done interface element 1648, etc.

Figure 17:
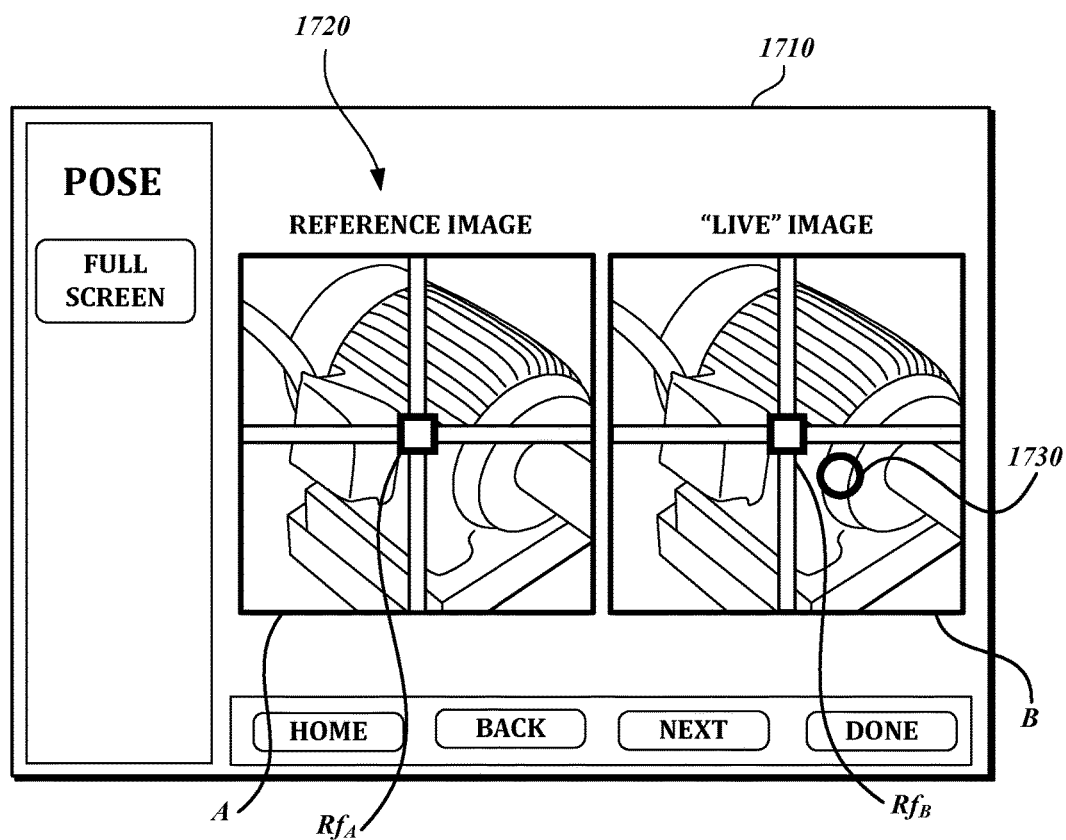
FIG. 17 is one example of a Connect devices interface in accordance with aspects of the present disclosure.

In the embodiment shown in FIG. 15, the Take Image interface 1510 may also include a Pose guide interface element 1518. Upon actuation of, for example, the Pose guide interface element, a Pose interface 1710 is generated, one example of which is shown in FIG. 17. The Pose guide interface 1710 aids the user in taking images of the DUT. In particular, the Pose guide interface 1710 aids the user in taking the same or similar views of the DUT. As best shown in FIG. 17, among other things, the Pose interface 1710 may include information 1720 in the form of one or more images, for viewing by the user. In one embodiment, the information 1720 is in the form of a first image A, which is a reference image of a previously tested asset, and a second image B, which is a live image of the same asset, referred to as the DUT. The first image A includes reference frame $Rf_A$. The second image B includes reference frame $Rf_B$. It is to be appreciated that reference frame $Rf_A$ corresponds to reference frame $Rf_B$, and in the illustrated embodiment, corresponds to the center of image A. The second image B further shows the center of an image sensor of the measurement device. The center of the image sensor is represented on the display as a cursor 1730. As the measurement device moves in a two-dimensional plane parallel to the DUT, the cursor 1730 moves accordingly on the display. When the cursor 1730 is aligned with the reference frame $Rf_B$, the image sensor of the thermal imaging system is substantially aligned with the reference image. In that regard, the thermal imaging system is able to obtain an image that corresponds to the reference image and forward it to the computing device. That is, the measurement device may position a measurement at approximately the same position as indicated in the reference measurement. Although the illustrated embodiment applies to a thermography image, it is to be appreciated that the Pose feature could be used with other measurement devices.

Figure 18:
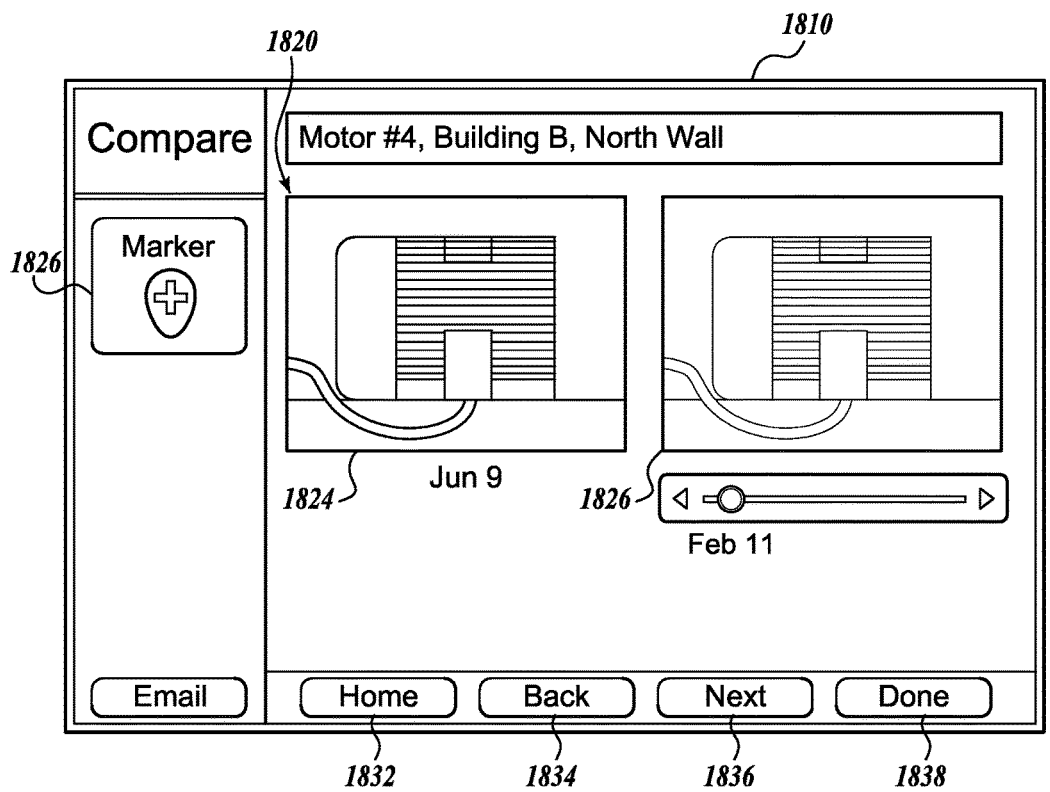
FIG. 18 is one example of a Connect devices interface in accordance with aspects of the present disclosure.

FIG. 18 is one example of a Compare interface 1810 that is generated by the interface 256 and presented to the user via the display 270 upon actuation, for example, the Compare Images interface element 526 in FIG. 5. As best shown in FIG. 18, the Compare Images interface 1810 comprises interface elements that allow the user to compare an obtained image with an image from an earlier maintenance test date. In the example shown, the image of an electric motor was taken by a thermal imaging system. In that regard, the Compare Images interface 1810 includes information 1820 in the form of a current image 1824 and a previously taken image 1826 stored in the computing device or the maintenance service provider 124. It will be appreciated that the previous image 1826 may include a plurality of previously stored images corresponding to the current image and scrollable by date, etc. Also, it will be appreciated that the vantage point of the images should be the same or substantially similar in order to obtain useful comparisons of the images. In one embodiment, the Pose interface 1710 of the take images interface may be used in order to obtain images that have substantially the same alignment.

The Compare Images interface 1810 may also include a Marker interface element 1826, among others. Upon actuation, the Marker interface element 1826 allows measurements to be taken at a precise location on the image. The Compare Images interface 1810 may further include navigational interface elements that include, for example, a Home interface element 1832, a Back interface element 1834, a Next interface element 1836, a Done interface element 1838, etc.

Figure 19:
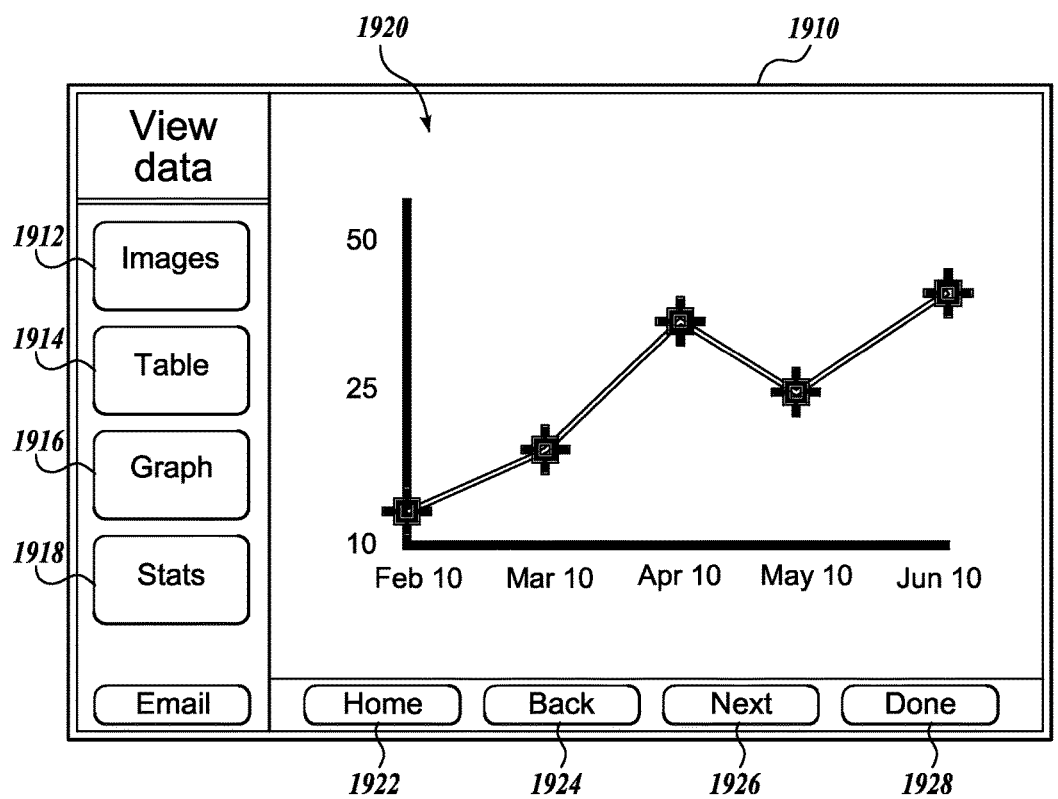
FIG. 19 is one example of a Connect devices interface in accordance with aspects of the present disclosure.

FIG. 19 is one example of a View data interface 1910 that is generated by the interface 256 and presented to the user via the display 270 upon actuation of, for example, the View data interface element 528 in FIG. 5. As best shown in FIG. 19, the View data interface 1910 comprises interface elements that include, for example, Images interface element 1912, Table interface element 1914, Graph interface element 1916, Stats interface element 1918, among others. As best shown in FIG. 19, among other things, the View data interface 1910 may include information 1920 in the form of text, graphs, images, tables, etc., of a DUT in question, and/or the like. The information 1920 may be displayed as a result of actuation of one of the interface elements 1912-1918, or other means. In the example shown, the information 1920 represents a trend of a measured parameter of a DUT between a start date and an end date. In one embodiment, the information represents trend data of a marked location on an image of a DUT, such as an electric motor. The View data interface 1910 also includes navigational interface elements that include, for example, a Home interface element 1922, a Back interface element 1924, a Next interface element 1926, a Done interface element 1928, etc.

FIG. 20 is one example of a Route interface 2010 that is generated by the provider interface 256 and presented to the user via the display 270 upon actuation of, for example, the Route interface element 520 in FIG. 5. As best shown in FIG. 20, the Route interface 2010 comprises interface elements that include, for example, an Add Asset interface element 2012, a Review Records interface element 2014, a New Route interface element 2016, among others. As best shown in FIG. 20, among other things, the Route interface 2010 may include information 2020 in the form of text, maps, lists, tables, etc., of a DUT in question, and/or the like. The information 220 may provide the identity and/or location of each of the assets on the list. For instance, the list may include asset name, asset type, and location, as shown in FIG. 20. In some embodiments, the information may further indicate the order in which each asset is to be tested. The Route interface 2010 may also include navigational interface elements that include, for example, a Home interface element 2022, a Back interface element 2024, a Next interface element 2026, a Done interface element 2028, etc.

Figure 3:
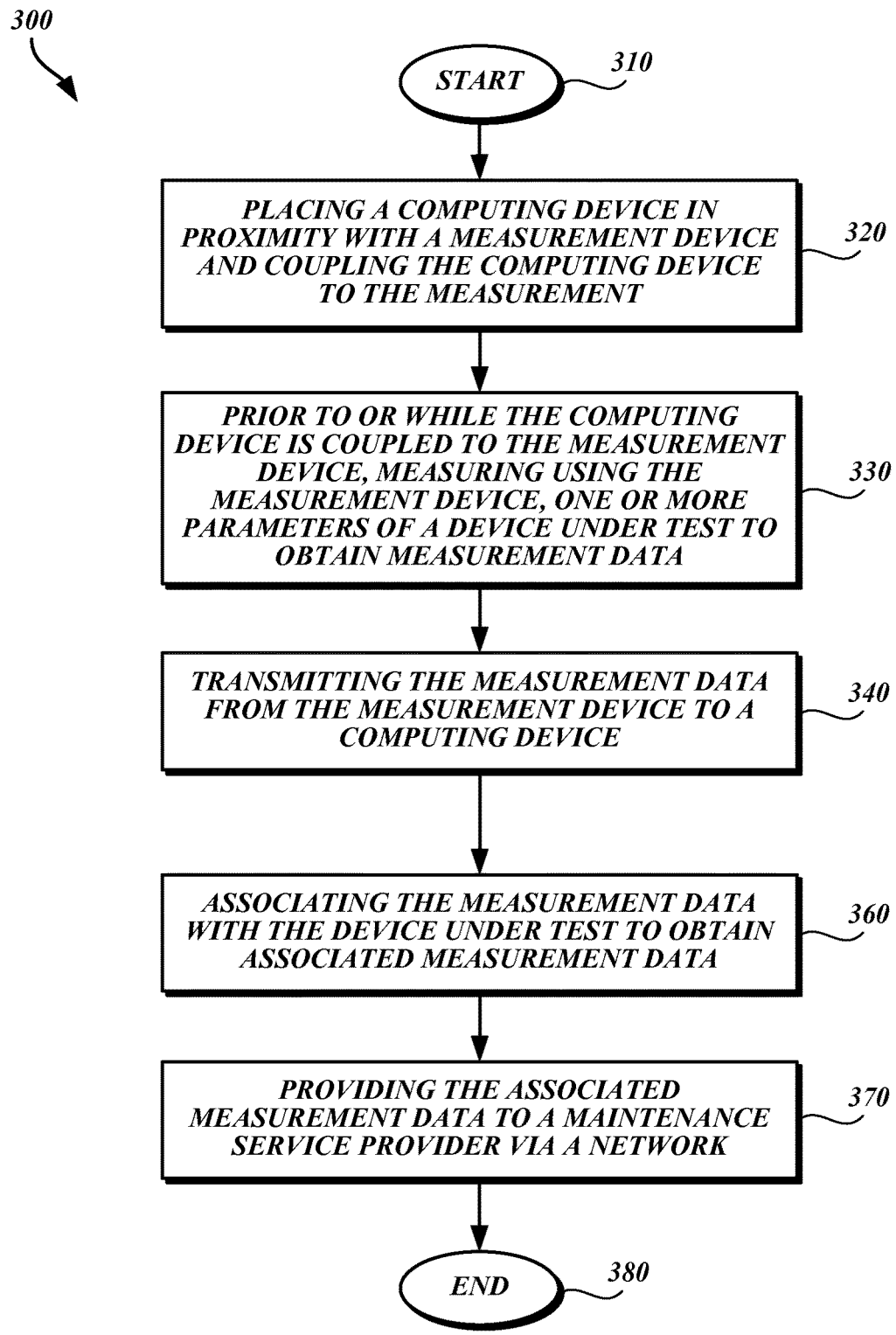
FIG. 3 is a flow chart illustrating one example of a method for obtaining and maintaining maintenance records in accordance with aspects of the present disclosure.

Returning now to FIG. 3, one example of a method 300 of obtaining and maintaining maintenance records will now be described. The method begins at block 310 and proceeds to block 320. At block 320, a computing device, such as computing device 112 (FIG. 1), is placed in proximity with a measurement device, such as measurement device 108 (FIG. 1) and coupled in communication with the measurement device 108. In some embodiments, a communication link can be established automatically while in other embodiments, the communication link is established via user input, such as through the Connect devices interface 610. At block 330, prior to or while the computing device is coupled to the measurement device, one or more parameters of a device under test are measured by the measurement device 108 to obtain measurement data. At block 340, the measurement data is transmitted from the measurement device 108 to the computing device 112. At block 360, the measurement data is associated with the device under test to obtain associated measurement data. In some embodiments, the measurement data is associated with the device under test (DUT) by selecting the DUT from a list of devices on the computer device 112. Alternatively, identity information (e.g., name, serial number, etc.) about the DUT can be obtained by the computing device 112 via an automating system 276 and associated with the measurement data. In other embodiments, the measurement data is associated with the device under test (DUT) by accessing an asset record corresponding to the DUT. At block 370, the associated measurement data is provided to a maintenance service provider 124 via a network, such as network 116 (FIG. 1). The method ends at block 380.

The above blocks may be performed sequentially, in parallel, or in a different order than those described herein. It is to be appreciated that in some implementations one or more of the illustrated blocks may be eliminated, combined, or separated into additional blocks. Furthermore, the method 300 may include additional blocks not shown.

Figure 4:
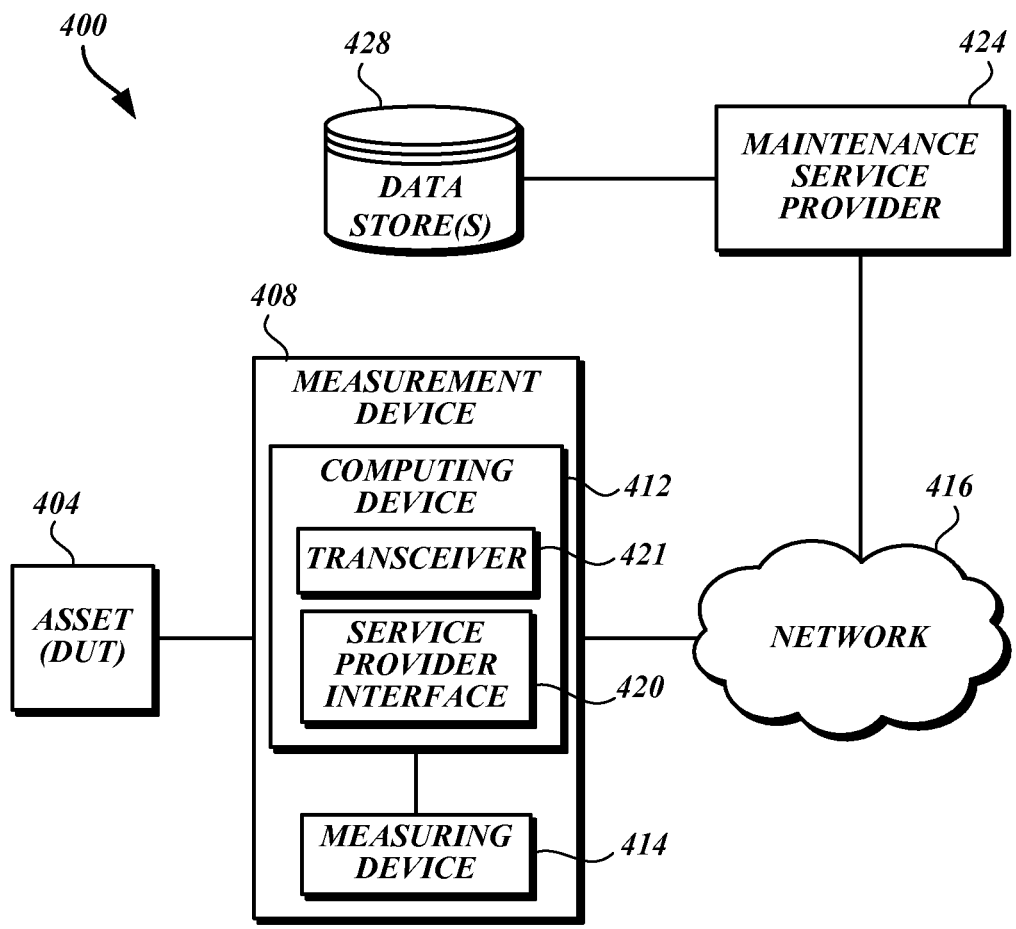
FIG. 4 is a block diagram of another example of a system for obtaining and maintaining maintenance records in accordance with aspects of the present disclosure.

FIG. 4 is another example of a system 400 for obtaining and maintaining maintenance records in accordance with aspects of the present disclosure. The system 400 is substantially identical in components and operation as the system 100 of FIG. 1, except for the differences that will be described in greater detail below. For clarity in the ensuing descriptions, numeral references of like elements of the system 100 are similar, but in the 400 series for the illustrated embodiment and an explanation of the function and operation of these components will not be repeated. As is best shown in FIG. 4, the system 400 includes a measurement device 408 comprising a computing device 412 that is substantially similar in components and operation to the computing device 112 of FIG. 1. The measurement device 408 further includes at least one measuring device 414, such as a sensor, probe, and the like, to measure one or more parameters of the asset 404. In one embodiment, the measuring device is a thermal imaging system. The measurement device 408 can be coupled to the maintenance service provider 424 via the network 416 and includes a transceiver 421 for allowing communication with the maintenance service provider 424. Therefore, rather than providing maintenance data between the computing device and the maintenance service provider as in system 100, maintenance data is provided directly between the measurement device 408 and the maintenance service provider 424 in system 400.

Various principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure.

The embodiments of the invention in which an exclusive property or privilege is claimed are defined as follows:

1. A method of obtaining and maintaining maintenance records, comprising:
   establishing a communication link between a computing device and a measurement device that is configured to measure one or more electrical or physical parameters of a device under test (DUT), wherein the measurement device includes an imaging system;
   prior to or after establishing the communication link, measuring, using the measurement device, one or more electrical or physical parameters of the DUT to obtain measurement data;
   transmitting the measurement data from the measurement device to the computing device via the communication link, the measurement data including the measured one or more electrical or physical parameters of the DUT;
   generating, by the computing device, associated measurement data, the associated measurement data including the measurement data received from the measurement device and an indication of the DUT, wherein said generating associated measurement data comprises creating, at the computing device, a DUT record for the device under test including at least one of a DUT name, DUT type, and DUT location;
   receiving, via user input at the computing device, data to be associated with testing of the DUT and storing said data with the associated measurement data in the DUT record, wherein the data to be associated with testing of the DUT is in one or more of the following formats: an audio format; a video format; and a text format;
   obtaining a first image of the DUT as previously tested and displaying, by the computing device, the first image as a reference image with a first reference frame that corresponds to a center of the reference image;
   receiving a live image of the DUT from an image sensor in the imaging system and displaying, by the computing device, the live image with a second reference frame that corresponds to the first reference frame, wherein the display of the live image further includes a cursor that represents a center of the image sensor, and wherein the cursor moves on the display as the measurement device moves in a two-dimensional plane parallel to the DUT;
   aligning the cursor with the second reference frame and obtaining a second image of the DUT that is substantially aligned with the reference image;
   storing the second image with the associated measurement data in the DUT record; and
   providing the associated measurement data for the DUT from the computing device to a service provider via a network.

2. The method of claim 1, wherein said establishing a communication link between the measurement device and the computing device occurs by executing an interface that causes communication circuitry to automatically perform a coupling process when the computing device is placed in proximity of the measurement device such that the computing device is capable of receiving one or more signals from the measurement device.

3. The method of claim 1, wherein said establishing a communication link between the measurement device and the computing device occurs upon input to the computing device.

4. The method of claim 1, wherein the measurement device is selected from a group consisting of a multimeter, an oscilloscope, a thermal imaging system, a thermometer, a calibration tool, and a cable tester.

5. The method of claim 1, wherein one or more electrical or physical parameters are selected from a group consisting of electrical parameters, temperature, pressure, visible light waves, and invisible light waves.

6. The method of claim 1, further comprising:
   on the computing device, displaying the associated measurement data.

7. The method of claim 1, wherein the data associated with testing of the DUT is selected from a group consisting of status of the device under test, severity of a problem of the device under test, one or more actions that need to be taken based on the results of the test, one or more notes that need to be documented, and additional information that may be helpful to another technician.

8. The method of claim 1, wherein said generating the associated measurement data includes:
   retrieving, from the service provider, a DUT record corresponding to the DUT.

9. The method of claim 1, wherein said generating the associated measurement data includes:
   obtaining, using an automation system, identity information of the DUT; and
   retrieving, from the service provider, a DUT record corresponding to the DUT based on the identity information.

10. The method of claim 1, wherein said generating the associated measurement data includes:
    on the computing device, selecting the device under test from a list of devices.

11. The method of claim 1, further comprising:
    retrieving, from the service provider, a DUT record corresponding to the DUT, wherein the DUT record includes measurement data collected from a prior test of the DUT; and comparing, by the computing device, the measurement data collected from the prior test of the DUT to the associated measurement data.

12. The method of claim 1, wherein the reference image is obtained from the service provider.

13. A system for obtaining and maintaining maintenance records, comprising:

a measurement device configured to measure at least one electrical or physical parameter of a device under test (DUT), wherein the measurement device includes an imaging system;

a computing device configured to be placed in communication with the measurement device, wherein the measurement device measures the at least one electrical or physical parameter of the DUT prior to or while in communication with the computing device, wherein the computing device is further configured to receive the at least one measured electrical or physical parameter from the measurement device and to generate at least one associated measured parameter, the at least one associated measured parameter including the at least one measured electrical or physical parameter received from the measurement device and an indication of the DUT, wherein generating the at least one associated measured parameter includes creating, at the computing device, a DUT record for the device under test including at least one of a DUT name, DUT type, and DUT location; and a service provider in communication with the computing device, wherein the service provider includes one or more interconnected computing devices and is configured to receive the at least one associated measured parameter and to store said at least one associated measured parameter, wherein the computing device is also configured to receive, via user input at the computing device, data to be associated with testing of the DUT and store said data with the associated measurement data in the DUT record, wherein the data to be associated with testing of the DUT is in one or more of the following formats: an audio format; a video format; and a text format; and wherein the computing device is further configured to:
obtain a first image of the DUT as previously tested and display the first image as a reference image with a first reference frame that corresponds to a center of the reference image;
receive a live image of the DUT from an image sensor in the imaging system and display the live image with a second reference frame that corresponds to the first reference frame, wherein the display of the live image further includes a cursor that represents a center of the image sensor, and wherein the cursor moves on the display as the measurement device moves in a two-dimensional plane parallel to the DUT;
when the cursor is aligned with the second reference frame, obtain a second image of the DUT that is substantially aligned with the reference image and store the second image with the associated measurement data in the DUT record.

14. The system of claim 13, wherein the measurement device is selected from a group consisting of a multimeter, an oscilloscope, a thermal imaging system, a thermometer, a calibration tool, and a cable tester.

15. The system of claim 13, wherein at least one electrical or physical parameter is selected from a group consisting of electrical parameters, temperature, pressure, visible light waves, and invisible light waves.

16. The system of claim 13, wherein the computing device is further configured to generate the at least one associated measured parameter by performing at least one of:
retrieving, from the service provider, a DUT record corresponding to the DUT;
obtaining, using an automation system, identity information of the DUT, and retrieving, from the service provider, a DUT record corresponding to the DUT based on the identity information; or
selecting the device under test from a list of devices generated by the computing device or obtained from the service provider.

17. A non-transitory computer-readable storage medium having instructions stored thereon that, in response to execution by a computing device, cause the computing device to:
establish a data communication link between the computing device and a measurement device when the measurement device is in proximity with the computing device such that the computing device is capable of receiving one or more signals from the measurement device;
receive measurement data from the measurement device, the measurement data including one or more measured parameters of a device under test (DUT) measured by the measurement device;
generate associated measurement data, the associated measurement data including the measurement data received from the measurement device and an indication of the DUT, wherein to generate the associated measurement data, the instructions cause the computing device to create a DUT record for the device under test including at least one of a DUT name, DUT type, and DUT location;
receive, via user input at the computing device, data to be associated with testing of the DUT and store said data with the DUT record, wherein the data to be associated with testing of the DUT is in one or more of the following formats: an audio format; a video format; and a text format;
obtain a first image of the DUT as previously tested and display the first image as a reference image with a first reference frame that corresponds to a center of the reference image;
receive a live image of the DUT from an image sensor in the imaging system and display the live image with a second reference frame that corresponds to the first reference frame, wherein the display of the live image further includes a cursor that represents a center of the image sensor, and wherein the cursor moves on the display as the measurement device moves in a two-dimensional plane parallel to the DUT;
when the cursor is aligned with the second reference frame, obtain a second image of the DUT that is substantially aligned with the reference image and store the second image with the associated measurement data in the DUT record; and
provide the associated measurement data to a service provider via a network.

18. A non-transitory computer-readable storage medium according to claim 17, further having instructions stored thereon that, in response to execution by a computing device, cause the computing device to perform at least one of:
select the device under test from a list of devices;

retrieve, from the service provider, a DUT record corresponding to the DUT; or obtain, using an automation system, identity information of the DUT, and retrieve, from the service provider, a DUT record corresponding to the DUT based on the identity information.

19. A non-transitory computer-readable storage medium according to claim 17, further having instructions stored thereon that, in response to execution by a computing device, cause the computing device to display the associated measurement data.

20. A non-transitory computer-readable storage medium according to claim 17, further having instructions stored thereon that, in response to execution by a computing device, cause the computing device to obtain the reference image from the service provider.

21. A non-transitory computer-readable storage medium according to claim 17, further having instructions stored thereon that, in response to execution by a computing device, cause the computing device to:

retrieve, from the service provider, a DUT record corresponding to the DUT, wherein the DUT record includes measurement data collected from a prior test; and compare the measurement data collected from a prior test to the associated measurement data.

* * * * *